(12) United States Patent
Koyama et al.

(10) Patent No.: US 8,432,254 B2
(45) Date of Patent: Apr. 30, 2013

(54) SEMICONDUCTOR DEVICE

(75) Inventors: Jun Koyama, Sagamihara (JP); Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 288 days.

(21) Appl. No.: 12/358,345

(22) Filed: Jan. 23, 2009

(65) Prior Publication Data
US 2009/0195359 A1   Aug. 6, 2009

(30) Foreign Application Priority Data
Jan. 31, 2008 (JP) ................................. 2008-020938

(51) Int. Cl.
*H04Q 5/22* (2006.01)
*G05B 11/01* (2006.01)
*H01L 21/00* (2006.01)

(52) U.S. Cl.
USPC .......... 340/10.1; 438/107; 438/110; 438/124; 340/10.42; 340/12.51

(58) Field of Classification Search ............... 340/572.8, 340/572.1; 252/387; 343/867
See application file for complete search history.

(56) References Cited

U.S. PATENT DOCUMENTS

| | | | |
|---|---|---|---|
| 5,075,166 A | 12/1991 | Sikorski et al. | |
| 5,163,837 A * | 11/1992 | Rowlette, Sr. | 439/91 |
| 5,478,996 A | 12/1995 | Muto et al. | |
| 5,597,631 A | 1/1997 | Furumoto et al. | |
| 5,757,456 A | 5/1998 | Yamazaki et al. | |
| 5,770,313 A | 6/1998 | Furumoto et al. | |
| 5,821,138 A | 10/1998 | Yamazaki et al. | |
| 5,879,502 A | 3/1999 | Gustafson | |
| 5,888,609 A | 3/1999 | Karttunen et al. | |
| 6,049,903 A | 4/2000 | Nishimura | |
| 6,078,791 A | 6/2000 | Tuttle et al. | |
| 6,223,990 B1 * | 5/2001 | Kamei | 235/492 |
| 6,224,965 B1 | 5/2001 | Haas et al. | |

(Continued)

FOREIGN PATENT DOCUMENTS

| | | |
|---|---|---|
| CN | 1684087 | 10/2005 |
| EP | 1092739 | 4/2001 |

(Continued)

OTHER PUBLICATIONS

Search Report (Application No. 09000602.4) Dated May 8, 2009.

(Continued)

*Primary Examiner* — Jennifer Mehmood
*Assistant Examiner* — Pameshanand Mahase
(74) *Attorney, Agent, or Firm* — Eric J. Robinson; Robinson Intellectual Property Law Office, P.C.

(57) ABSTRACT

An object is to increase the reliability of a semiconductor device which is capable of wireless communication. The semiconductor device includes a plurality of functional circuits as redundant circuits, and each of the plurality of functional circuits includes an antenna and a semiconductor integrated circuit. The plurality of functional circuits is covered with one sealing layer in which a fibrous body is impregnated with resin. Further, the semiconductor integrated circuit is provided with a transmission/reception circuit electrically connected to the antenna, a power supply circuit electrically connected to the transmission/reception circuit, and a logic circuit electrically connected to the transmission/reception circuit and the power supply circuit.

27 Claims, 21 Drawing Sheets

U.S. PATENT DOCUMENTS

| | | | |
|---|---|---|---|
| 6,403,221 B1 | 6/2002 | Nakamura et al. |
| 6,473,601 B1 | 10/2002 | Oda |
| 6,476,330 B2 | 11/2002 | Otsuka et al. |
| 6,482,495 B1 | 11/2002 | Kohama et al. |
| 6,530,147 B1 | 3/2003 | Haas et al. |
| 6,621,410 B1 | 9/2003 | Lastinger et al. |
| 6,805,958 B2 | 10/2004 | Nakamura et al. |
| 6,872,634 B2 | 3/2005 | Koizumi et al. |
| 6,903,377 B2 | 6/2005 | Yamazaki et al. |
| 6,926,794 B2 | 8/2005 | Kohama et al. |
| 7,049,178 B2 | 5/2006 | Kim et al. |
| 7,061,083 B1 | 6/2006 | Usami et al. |
| 7,067,392 B2 | 6/2006 | Yamazaki et al. |
| 7,154,449 B2 * | 12/2006 | Liu et al. ............. 343/867 |
| 7,230,316 B2 | 6/2007 | Yamazaki et al. |
| 7,230,580 B1 * | 6/2007 | Kelkar et al. .......... 343/870 |
| 7,262,464 B2 | 8/2007 | Takafuji et al. |
| 7,274,286 B2 | 9/2007 | Tagato |
| 7,465,674 B2 | 12/2008 | Tamura et al. |
| 7,470,461 B2 | 12/2008 | Jang et al. |
| 7,485,489 B2 | 2/2009 | Björbell |
| 7,495,256 B2 | 2/2009 | Yamazaki et al. |
| 7,649,463 B2 | 1/2010 | Tuttle |
| 7,667,310 B2 | 2/2010 | Dozen et al. |
| 7,685,706 B2 | 3/2010 | Maruyama et al. |
| 7,700,463 B2 | 4/2010 | Shimomura |
| 7,709,883 B2 | 5/2010 | Takano et al. |
| 7,727,859 B2 | 6/2010 | Watanabe et al. |
| 7,736,958 B2 | 6/2010 | Dozen et al. |
| 7,736,964 B2 | 6/2010 | Yamamoto et al. |
| 7,759,788 B2 | 7/2010 | Aoki et al. |
| 7,785,933 B2 | 8/2010 | Dozen et al. |
| 7,915,756 B2 | 3/2011 | Ikeda |
| 8,144,013 B2 | 3/2012 | Koyama et al. |
| 2002/0195590 A1 * | 12/2002 | Miksic et al. .......... 252/387 |
| 2003/0032210 A1 | 2/2003 | Takayama et al. |
| 2003/0228719 A1 * | 12/2003 | Koizumi et al. ........ 438/106 |
| 2004/0016118 A1 | 1/2004 | Haas et al. |
| 2004/0119820 A1 | 6/2004 | Nagao et al. |
| 2005/0045729 A1 * | 3/2005 | Yamazaki ............... 235/492 |
| 2005/0172215 A1 | 8/2005 | Squibbs et al. |
| 2005/0208899 A1 | 9/2005 | Hanabusa |
| 2005/0210302 A1 | 9/2005 | Kato et al. |
| 2005/0231370 A1 * | 10/2005 | Tagato ................... 340/572.1 |
| 2005/0233122 A1 | 10/2005 | Nishimura et al. |
| 2006/0170535 A1 * | 8/2006 | Watters et al. .......... 340/10.41 |
| 2007/0063920 A1 | 3/2007 | Shionoiri et al. |
| 2007/0089028 A1 | 4/2007 | Ito et al. |
| 2007/0210923 A1 * | 9/2007 | Butler et al. ........... 340/572.8 |
| 2007/0229281 A1 | 10/2007 | Shionoiri et al. |
| 2007/0241200 A1 | 10/2007 | Sawachi |
| 2007/0275506 A1 | 11/2007 | Yamazaki et al. |
| 2007/0278563 A1 | 12/2007 | Takano et al. |
| 2008/0012126 A1 | 1/2008 | Dozen et al. |
| 2008/0143531 A1 | 6/2008 | Tadokoro |
| 2008/0157928 A1 | 7/2008 | Butler et al. |
| 2008/0164975 A1 | 7/2008 | Butler et al. |
| 2008/0164977 A1 | 7/2008 | Butler et al. |
| 2008/0180249 A1 | 7/2008 | Butler et al. |
| 2008/0186137 A1 | 8/2008 | Butler et al. |
| 2008/0186138 A1 | 8/2008 | Butler et al. |
| 2008/0186139 A1 | 8/2008 | Butler et al. |
| 2008/0186180 A1 | 8/2008 | Butler et al. |
| 2008/0186182 A1 | 8/2008 | Kurokawa |
| 2008/0211630 A1 | 9/2008 | Butler et al. |
| 2008/0224941 A1 | 9/2008 | Sugiyama et al. |
| 2008/0252254 A1 | 10/2008 | Osada |
| 2008/0252459 A1 | 10/2008 | Butler et al. |
| 2008/0254572 A1 | 10/2008 | Leedy |
| 2009/0065746 A1 | 3/2009 | Aoki et al. |
| 2009/0152539 A1 | 6/2009 | Yamazaki et al. |
| 2009/0195387 A1 | 8/2009 | Koyama et al. |
| 2010/0237354 A1 | 9/2010 | Yamamoto et al. |
| 2010/0253478 A1 | 10/2010 | Koyama et al. |
| 2011/0121887 A1 | 5/2011 | Kato et al. |
| 2012/0145799 A1 | 6/2012 | Koyama et al. |

FOREIGN PATENT DOCUMENTS

| | | |
|---|---|---|
| EP | 1560148 A | 8/2005 |
| EP | 1589797 | 10/2005 |
| JP | 63-164630 | 7/1988 |
| JP | 05-190582 | 7/1993 |
| JP | 05-286065 | 11/1993 |
| JP | 08-250745 | 9/1996 |
| JP | 08-288522 | 11/1996 |
| JP | 10-092980 | 4/1998 |
| JP | 10-107650 | 4/1998 |
| JP | 2001-331120 | 11/2001 |
| JP | 2001-331772 | 11/2001 |
| JP | 2002-083277 | 3/2002 |
| JP | 2003-049388 | 2/2003 |
| JP | 2003-174153 | 6/2003 |
| JP | 2004-014956 | 1/2004 |
| JP | 2004-078991 | 3/2004 |
| JP | 2004-362341 | 12/2004 |
| WO | WO-96/09158 | 3/1996 |
| WO | WO 01/01740 | 1/2001 |
| WO | WO 2004/001848 | 12/2003 |
| WO | WO-2004/036652 | 4/2004 |
| WO | WO-2007/068002 | 6/2007 |
| WO | WO-2007/096793 | 8/2007 |
| WO | WO-2007/108371 | 9/2007 |

OTHER PUBLICATIONS

Chinese Office Action (Application No. 200910009909.2) Dated Sep. 5, 2012.

* cited by examiner

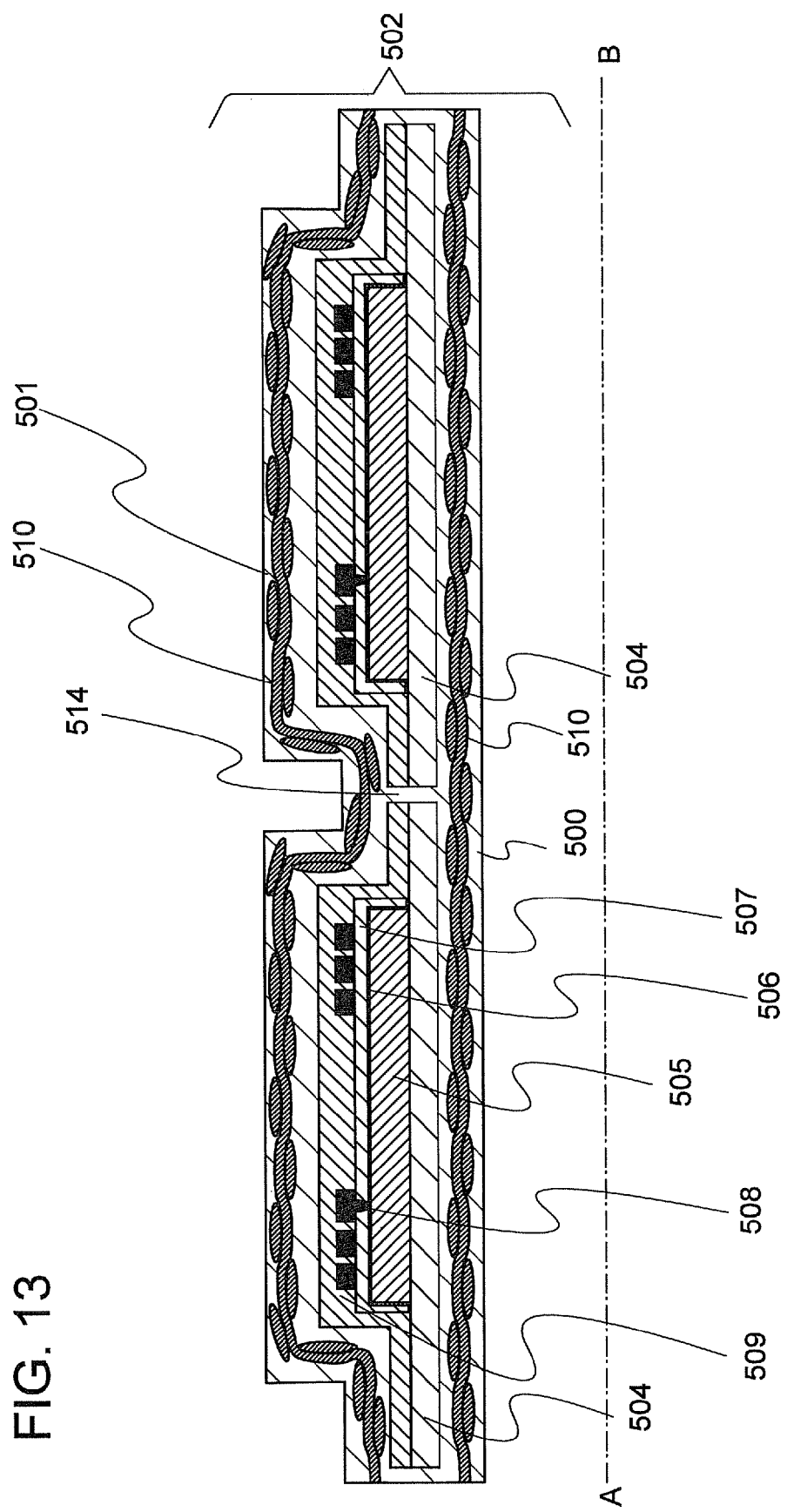

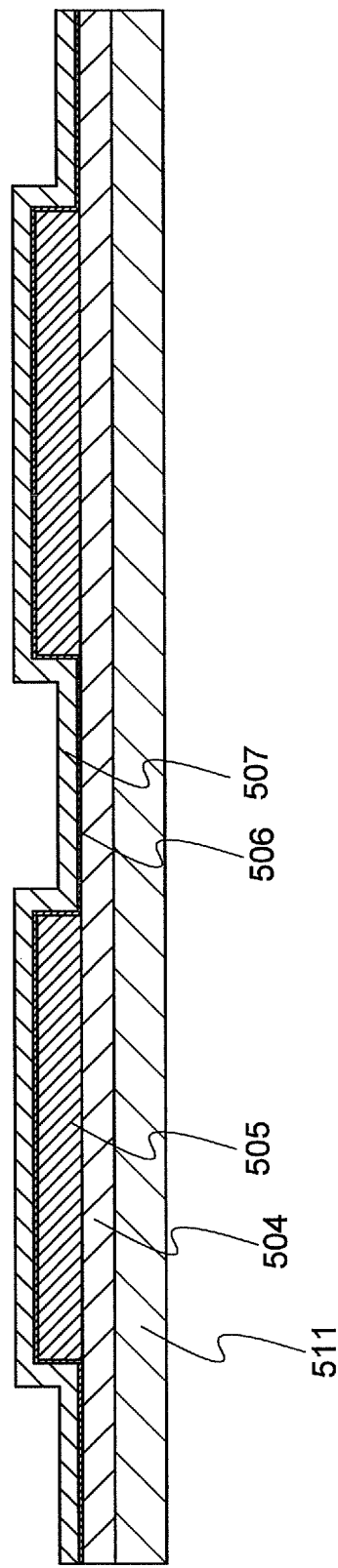
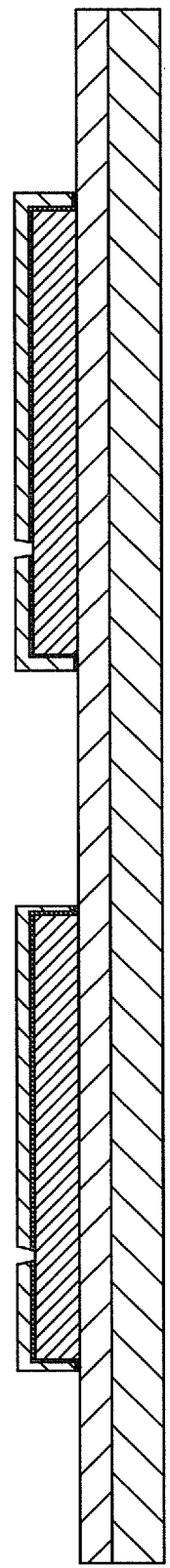
FIG. 14A
FIG. 14B

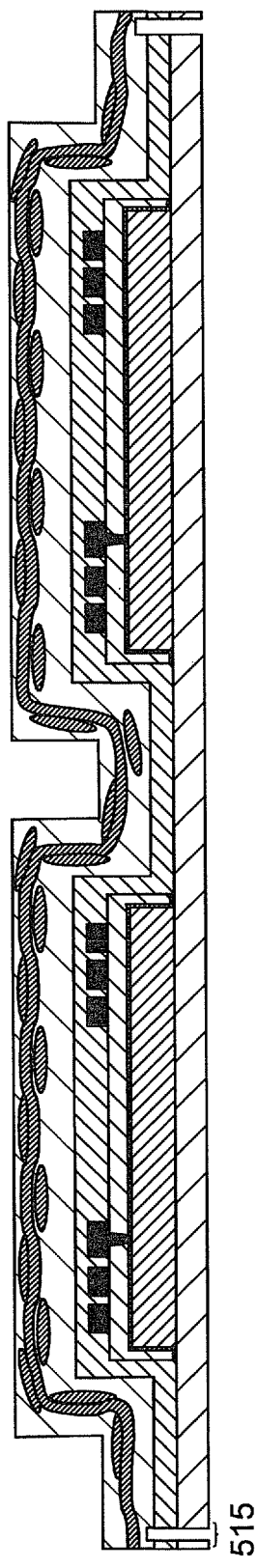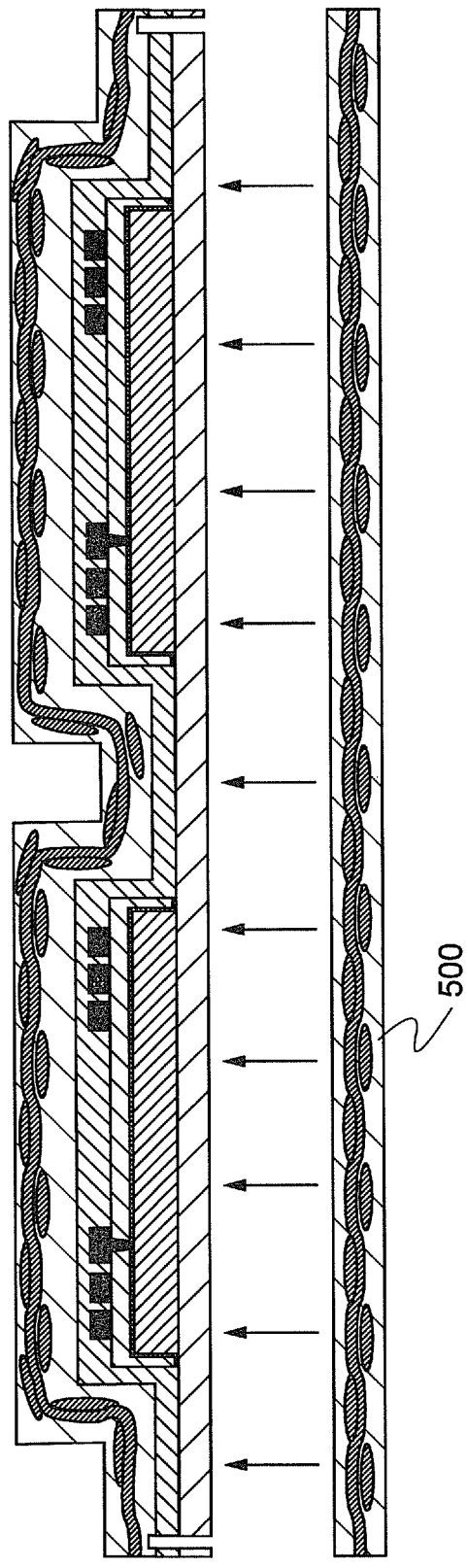
FIG. 17A
FIG. 17B

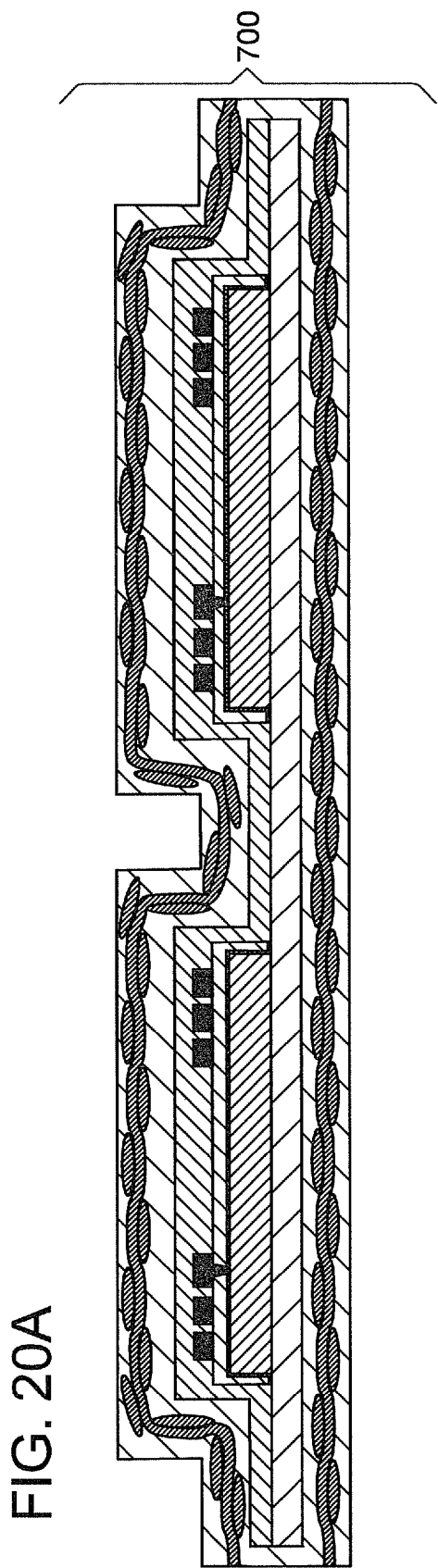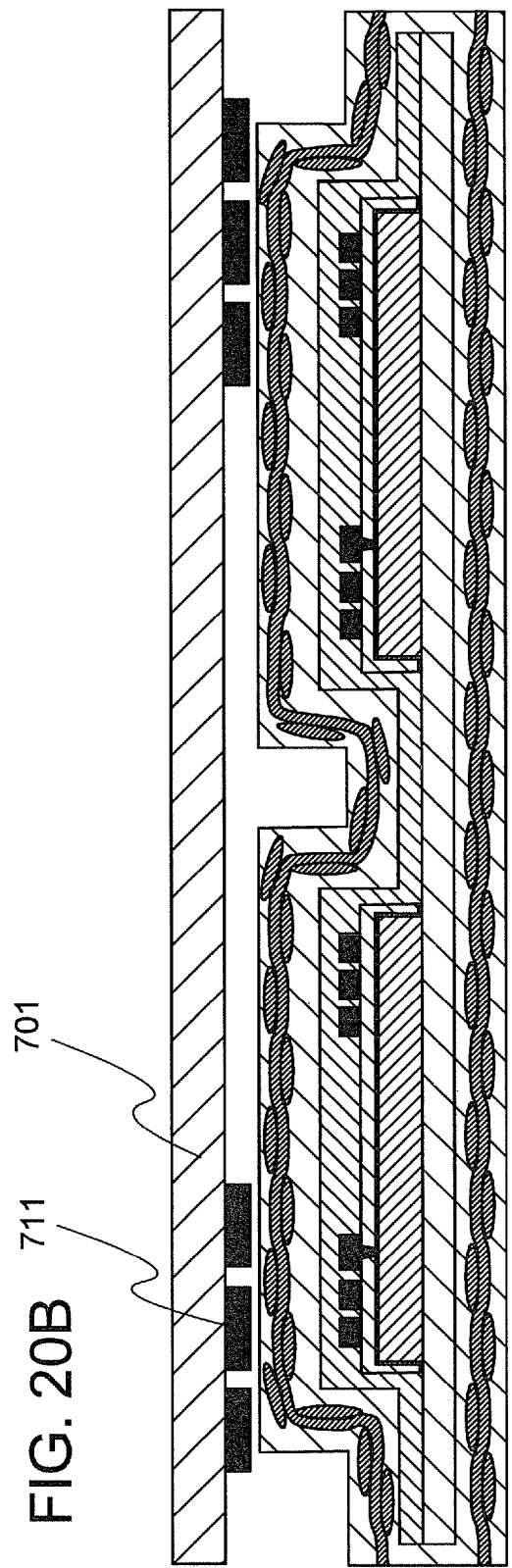

SEMICONDUCTOR DEVICE

BACKGROUND OF THE INVENTION

1. Field of the Invention

This invention relates to a semiconductor device which is capable of wireless communication.

2. Description of the Related Art

In recent years, an individual identification technology using wireless communication through an electromagnetic field, a radio wave, or the like has attracted attention. Specifically, as a semiconductor device which performs data communication through wireless communication, an individual identification technology which employs RFID (radio frequency identification) tags (e.g., non-contact IC (integrated circuit) tags, RF tags, wireless tags, electronic tags, transponders, or data carriers) has attracted attention. Individual identification technology which employs RFID tags (hereinafter referred to as RFID) is beginning to be made use of in production, management, and the like of individual objects, and it is expected that this technology will also be applied to personal authentication.

In order to obtain higher resistance to external force or the like and also flexibility, the above-described semiconductor device such as RFID has a structure in which a functional circuit body is sealed with a sealant such as resin. The thickness of the resin needs to be thin in order to make a semiconductor device flexible; however, resistance to external force cannot be adequately enhanced if the resin is thin, whereby the possibility of breaking is increased.

As an example of a measure against breaking due to external force, a structure in which a plurality of circuits having the same function is provided to increase redundancy (e.g., Patent Document 1: Japanese Published Patent Application No. 2002-083277). By providing the plurality of circuits having the same function (hereinafter those circuits are referred to as redundant circuits), when a defect due to breaking by external force or the like is detected in one of the plurality of circuits having the same function, another one of the plurality of circuits can be operated instead of the one judged as defective.

SUMMARY OF THE INVENTION

An object is to increase the reliability of a semiconductor device such as RFID by employing a structure with higher redundancy.

One aspect of the invention disclosed in this specification is a semiconductor device including a plurality of functional circuits having the same function, each of which is judged whether it is normal or not by a radio wave transmitted from outside and, when the functional circuit is judged as normal, is controlled whether to be operated or not by the radio wave transmitted from the outside. Each of the functional circuits includes an antenna and a semiconductor integrated circuit which stores identification information and is electrically connected to the antenna. Pieces of the identification information in the plurality of functional circuits are different from each other. The plurality of functional circuits is covered with one sealing layer.

The semiconductor integrated circuit may include a transmission/reception circuit electrically connected to the antenna, a power supply circuit electrically connected to the transmission/reception circuit, and a logic circuit electrically connected to the transmission/reception circuit and the power supply circuit.

Moreover, one aspect of the invention disclosed in this specification is a semiconductor device including a plurality of functional circuits having the same function, each of which is judged whether it is normal or not by a radio wave transmitted from outside and, when the functional circuit is judged as normal, is controlled whether to be operated or not by the radio wave transmitted from the outside, and a first antenna. Each of the functional circuits includes a second antenna for transmitting and receiving a radio wave by electromagnetic coupling with the first antenna and a semiconductor integrated circuit which stores identification information and is electrically connected to the second antenna. Pieces of the identification information in the plurality of functional circuits are different from each other. The plurality of functional circuits is covered with one sealing layer.

The semiconductor integrated circuit may include a transmission/reception circuit electrically connected to the second antenna, a power supply circuit electrically connected to the transmission/reception circuit, and a logic circuit electrically connected to the transmission/reception circuit and the power supply circuit.

Moreover, one aspect of the invention disclosed in this specification is a semiconductor device including a plurality of functional circuits having the same function, each of which is judged whether it is normal or not by a radio wave transmitted from outside and, when the functional circuit is judged as normal, is controlled whether to be operated or not by the radio wave transmitted from the outside. Each of the functional circuits includes an antenna and a semiconductor integrated circuit. The semiconductor integrated circuit includes a transmission/reception circuit electrically connected to the antenna, a power supply circuit electrically connected to the transmission/reception circuit, a logic circuit which stores identification information and is electrically connected to the transmission/reception circuit and the power supply circuit, a power supply control circuit electrically connected to the power supply circuit and the logic circuit, and a judging circuit electrically connected to the logic circuit and the power supply control circuit. Pieces of the identification information in the plurality of functional circuits are different from each other.

Moreover, one aspect of the invention disclosed in this specification is a semiconductor device including a plurality of functional circuits having the same function, each of which is judged whether it is normal or not by a radio wave transmitted from outside and, when the functional circuit is judged as normal, is controlled whether to be operated or not by the radio wave transmitted from the outside, and a first antenna. Each of the functional circuits includes a second antenna for transmitting and receiving a radio wave by electromagnetic coupling with the first antenna and a semiconductor integrated circuit. The semiconductor integrated circuit includes a transmission/reception circuit electrically connected to the second antenna, a power supply circuit electrically connected to the transmission/reception circuit, a logic circuit which stores the identification information and is electrically connected to the transmission/reception circuit and the power supply circuit, a power supply control circuit electrically connected to the power supply circuit and the logic circuit, and a judging circuit electrically connected to the logic circuit and the power supply control circuit. Pieces of the identification information in the plurality of functional circuits are different from each other.

The plurality of functional circuits may be covered with one sealing layer.

Note that in this document (the specification, the scope of claims, the drawing, and the like), a transistor includes at least three terminals of a gate terminal, a source terminal, and a drain terminal. The gate terminal is part of a gate electrode portion (including a conductive layer, a wiring layer, and the like) or a portion which is electrically connected to a gate electrode. In addition, the source terminal is part of a source electrode portion (including a conductive layer, a wiring layer, and the like) or a portion which is electrically connected to a source electrode. In addition, the drain terminal is part of a drain electrode portion (including a conductive layer, a wiring layer, and the like) or a portion which is electrically connected to a drain electrode.

In addition, in this document (the specification, the scope of claims, the drawing, and the like), since a source terminal and a drain terminal of a transistor are switched to each other depending on the structure, an operating condition, or the like of the transistor, it is difficult to define which is the source terminal or the drain terminal. Thus, in this document (the specification, the scope of claims, the drawing, and the like), one terminal selected from a source terminal and a drain terminal at will is denoted as "one of the source terminal and the drain terminal," and the other terminal is denoted as "the other of the source terminal and the drain terminal."

The reliability of a semiconductor device which is capable of wireless communication can be increased.

BRIEF DESCRIPTION OF THE DRAWINGS

In the accompanying drawings;

FIG. 13 is a cross-sectional view illustrating another structure of the semiconductor device in Embodiment Mode 3, FIGS. 14A and 14B are cross-sectional views illustrating a manufacturing method of a semiconductor device in Embodiment Mode 3, FIGS. 17A and 17B are cross-sectional views illustrating a manufacturing method of a semiconductor device in Embodiment Mode 3, FIGS. 20A and 20B are cross-sectional views illustrating a manufacturing method of a semiconductor device in Embodiment Mode 3.

DETAILED DESCRIPTION OF THE INVENTION

Embodiment modes of the invention disclosed in this specification will be hereinafter described with reference to the drawings. However, the invention disclosed in this specification is not limited to the following explanation. It is easily understood by a person skilled in the art that the mode and the detail of the invention disclosed in this specification can be variously changed without departing from the spirit and scope of the invention. Therefore, the invention disclosed in this specification should not be construed as being limited to the description in the following embodiment modes.

(Embodiment Mode 1)

In this embodiment mode, a semiconductor device will be described as an aspect of the invention disclosed in this specification.

Figure 1:
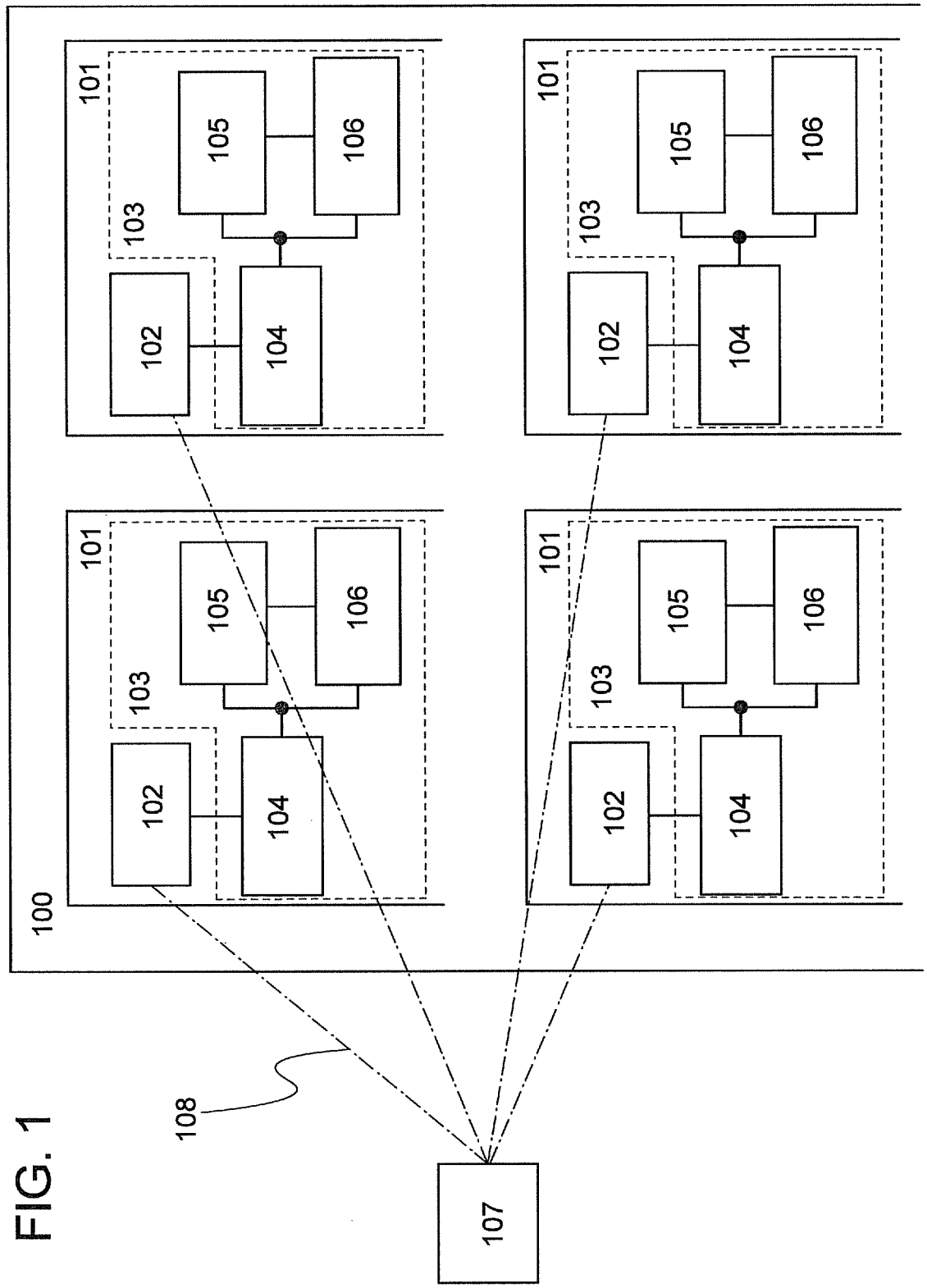
FIG. 1 is a block diagram illustrating a structure of a semiconductor device in Embodiment Mode 1.

First, a circuit configuration of a semiconductor device of this embodiment mode will be described with reference to FIG. 1. FIG. 1 is a block diagram illustrating the circuit configuration of the semiconductor device of this embodiment mode.

As shown in FIG. 1, a semiconductor device 100 includes a plurality of functional circuits 101. The functional circuits 101 each includes an antenna 102 and a semiconductor integrated circuit 103 electrically connected to the antenna 102.

The functional circuit 101 has functions of generating a power supply voltage by using a radio wave (a carrier wave or the like) received at the antenna 102 and operating by using the power supply voltage in accordance with a command of a signal in the radio wave received at the antenna 102. In addition, the plurality of functional circuits 101 have the same function and function as redundant circuits which are capable of performing the same operation.

In addition, the plurality of functional circuits 101 has identification information different from each other. The different identification information can be generated by using a difference in the positions of the respective functional circuits 101, a difference in the amount of time for transmission or reception of signals, a difference in the frequency of response signals, or the like.

The antenna 102 has a function of exchanging data by transmission/reception of radio waves to/from an external wireless communication device (a device which is capable of data transmission/reception through wireless communication with the semiconductor device 100, such as a reader, a reader/writer, or an interrogator) 107 or the like. For example, the functional circuit 101 can transmit a signal generated in the functional circuit 101 to the external wireless communication device 107 via the antenna 102 by a radio wave 108. In addition, by using an on-chip antenna as the antenna 102 by way of example, contact failure between the antenna 102 and the semiconductor integrated circuit 103 can be suppressed.

Note that it is preferable that the frequency of a radio wave used between the external wireless communication device 107 and the semiconductor device 100 be approximately 30 MHz or more and 5 GHz or less. For example, a frequency band of 950 MHz, 2.45 GHz, or the like may be employed.

In addition, as a transmission method of a signal, which is applied to the antenna 102, for example, an electromagnetic coupling method, an electromagnetic induction method, a microwave method, or the like can be used in accordance with the frequency of the signal. A transmission method can be selected in consideration of use application, and an antenna with the optimal length or shape may be provided in accordance with the transmission method.

The semiconductor integrated circuit 103 is a circuit in which a plurality of semiconductor elements is brought together in order to obtain a particular function. As a semiconductor element, for example, one or some of a transistor, a diode, a resister element, and a capacitor element can be used as appropriate. In addition, the identification information is stored in the semiconductor integrated circuit 103.

Note that the plurality of functional circuits 101 is preferably covered with one sealing layer. By covering the plurality of functional circuits 101 with one sealing layer, mixing of impurities such as water from the outside can be suppressed, and resistance to external force can be increased. As the sealing layer, for example, a material formed of fibrous bodies impregnated with resin, (for example, prepreg) or the like can be used.

Further, the semiconductor integrated circuit 103 includes a transmission/reception circuit 104 electrically connected to the antenna 102, a power supply circuit 105 electrically connected to the transmission/reception circuit 104, and a logic circuit 106 electrically connected to the transmission/reception circuit 104 and the power supply circuit 105. However, the semiconductor integrated circuit 103 is not limited to the above-described structure; for example, a structure with another additional circuit may also be employed.

The transmission/reception circuit 104 has functions of generating a signal from a radio wave received at the antenna 102, and outputting the signal to the power supply circuit 105 and the logic circuit 106. The transmission/reception circuit 104 can be formed of, for example, a rectifier circuit, a modulation circuit, a demodulation circuit, and the like.

The power supply circuit 105 has a function of generating power supply voltage from a signal generated in the transmission/reception circuit 104. The generated power supply voltage is output to the logic circuit 106.

The logic circuit 106 has a function of performing predetermined operation in accordance with the content of a command of a signal in a radio wave received at the antenna 102, by with the power supply voltage supplied from the power supply circuit 105. A memory circuit is provided for the logic circuit 106, and data (identification information or the like) for performing operation in accordance with the command of the signal in the radio wave received at the antenna 102 is written to the memory circuit.

Note that although FIG. 1 illustrates a structure in which four functional circuits are provided as the plurality of functional circuits, the structure is not limited to this. As long as at least two or more functional circuits are provided, they can be referred to as the plurality of functional circuits. For example, more than four functional circuits may be provided.

Figure 2:
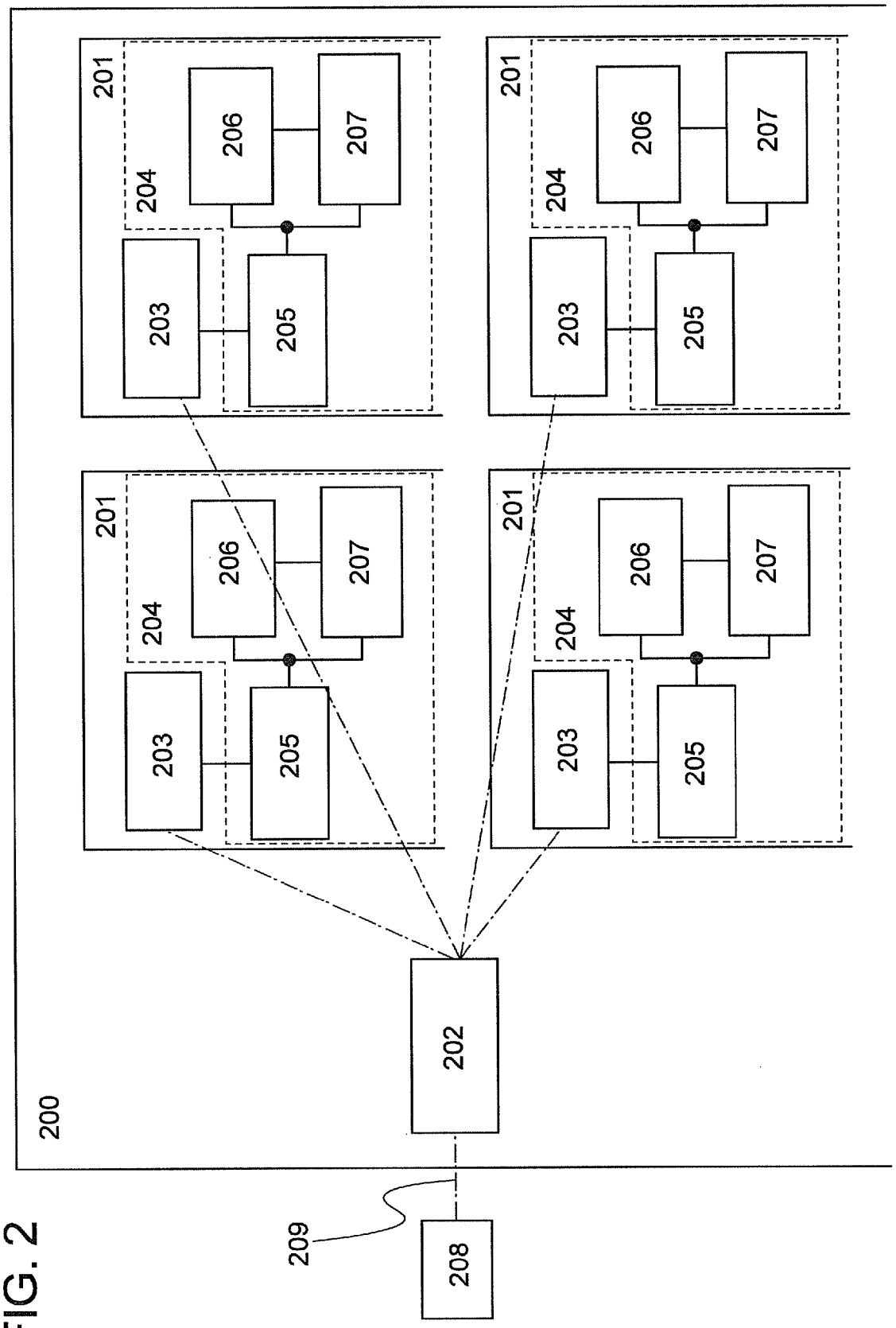
FIG. 2 is a block diagram illustrating another structure of the semiconductor device in Embodiment Mode 1.

Further, in this embodiment mode, a booster antenna besides the antenna provided in the functional circuit may be provided to the semiconductor device. A structural example of the semiconductor device provided with the booster antenna will be described with reference to FIG. 2. FIG. 2 is a block diagram illustrating another structure of the semiconductor device in this embodiment mode.

A semiconductor device 200 of this embodiment mode shown in FIG. 2 includes a plurality of functional circuits 201 and a first antenna 202. The functional circuits 201 each include a second antenna 203 and a semiconductor integrated circuit 204 electrically connected to the second antenna 203.

Further, the semiconductor integrated circuit 204 includes a transmission/reception circuit 205 electrically connected to the second antenna 203, a power supply circuit 206 electrically connected to the transmission/reception circuit 205, and a logic circuit 207 electrically connected to the transmission/reception circuit 205 and the power supply circuit 206.

The semiconductor integrated circuit 204 corresponds to the semiconductor integrated circuit 103 in FIG. 1. Descriptions of the structure and a function of the semiconductor integrated circuit 204 are incorporated in those of the semiconductor integrated circuit 103 in FIG. 1.

In addition, the transmission/reception circuit 205, the power supply circuit 206, and the logic circuit 207 correspond to the transmission/reception circuit 104, the power supply circuit 105, and the logic circuit 106 which are shown in FIG. 1, respectively. Descriptions of functions of respective circuits are incorporated in those of the transmission/reception circuit 104, the power supply circuit 105, and the logic circuit 106.

The second antenna 203 corresponds to the antenna 102 shown in FIG. 1. In addition, the first antenna 202 is also referred to as a booster antenna and can transmit and receive a signal by magnetic field coupling with the second antenna 203. Moreover, the first antenna 202 has a function of exchanging data with, for example, the external wireless communication device 208 by transmission/reception of a radio wave 209. For example, when a radio wave is transmitted from the external wireless communication device 208 to the first antenna 202, alternating current is generated in the first antenna 202, and a magnetic field is generated in the vicinity of the first antenna 202. Thus, induced electromotive force is generated in the second antenna 203 by magnetic field coupling between the first antenna 202 and the second antenna 203. The functional circuit 201 operates with the induced electromotive force and is capable of transmission/reception of the radio wave 209 via the first antenna 202. In addition, in the case where a signal is transmitted as a radio wave from the functional circuit 201 to the external wireless communication device 208, in accordance with a signal generated in the functional circuit 201, the second antenna 203 is magnetic-field coupled with the first antenna 202 by applying current to the second antenna 203. Induced electromotive force is generated in the first antenna 202 which is magnetic-field coupled with the second antenna 203, and the radio wave 209 is transmitted to the external wireless communication device 208 via the first antenna 202.

As described above, by employing the structure in which the booster antenna is provided besides the antenna provided in the functional circuit, a frequency band of receivable radio waves is not restricted, whereby a communication distance can be extended.

In a semiconductor device of this embodiment mode, whether each of the plurality of functional circuits is normal or not is judged.

Next, selecting operation of the plurality of functional circuits will be described. Note that, here, supposing that the structure of the semiconductor device is that shown in FIG. 1 by way of example, the selecting operation will be described.

Figure 3:
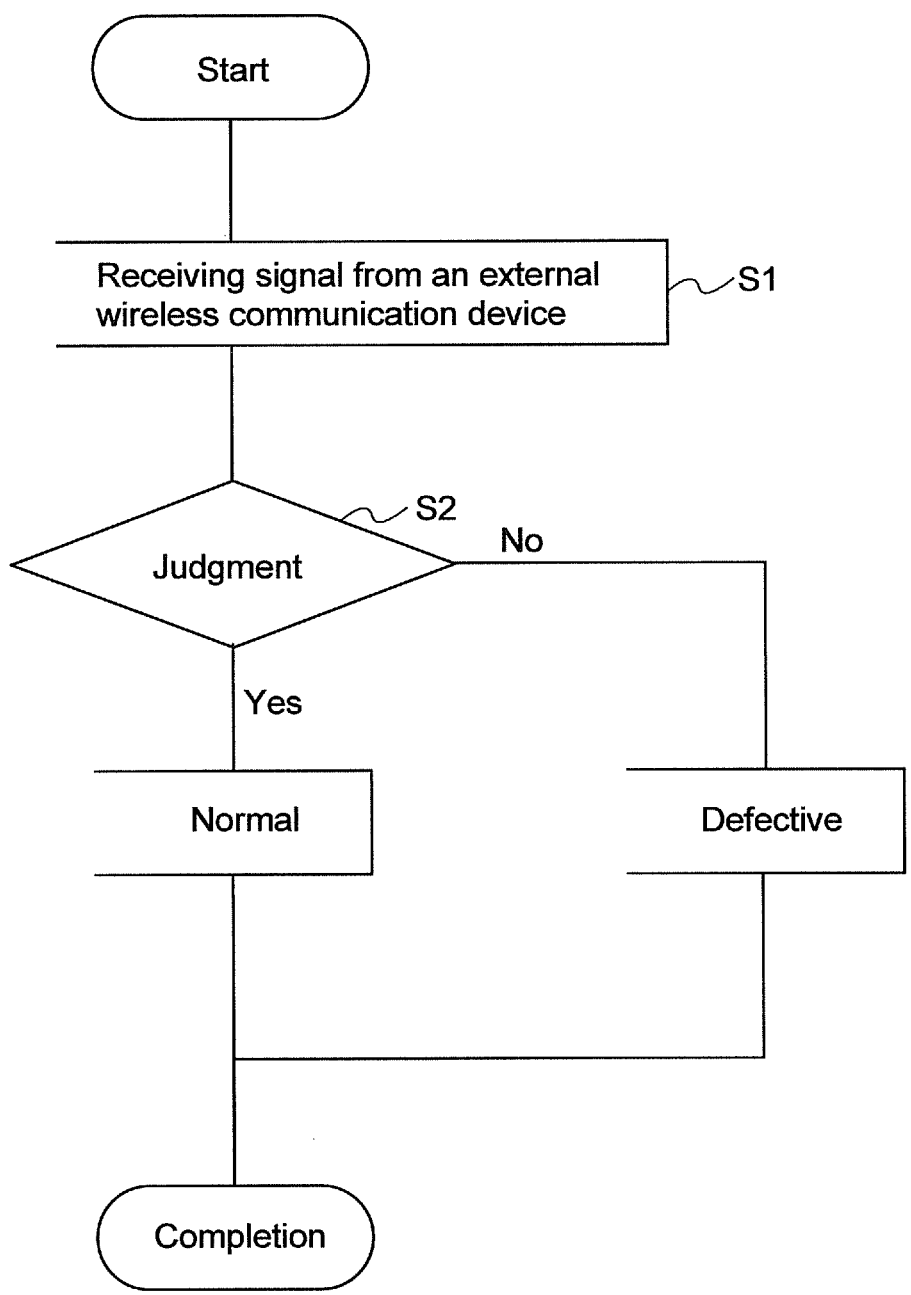
FIG. 3 is a flow chart illustrating selecting operation of a functional circuit in a semiconductor device in Embodiment Mode 1.

As selecting operation of the functional circuit, whether the functional circuit is normal or not is judged in the power supply circuit 105 (hereinafter this operation is referred to as a judging process). The judging process in the power supply circuit 105 will be described with reference to FIG. 3. FIG. 3 is a flow chart that illustrates selecting operation of the functional circuit in the semiconductor device according to one aspect of the invention disclosed in this specification.

As shown in FIG. 3, as a first step (S1 in FIG. 3) after the start, a radio wave is transmitted from the external wireless communication device 107 to the plurality of functional circuits.

Next, as a second step (S2 in FIG. 3), a judging process of the power supply circuit 105 is performed by judging whether each of the functional circuits 101 operates or not. A functional circuit 101 which operates (is judged as Yes) transmits a radio wave corresponding to a response signal to the external wireless communication device 107 via the antenna 102. The functional circuit 101 which has transmitted the radio wave corresponding to the response signal to the external wireless communication device 107 is judged as normal. Meanwhile, a functional circuit which does not operate (is judged as No) is judged as defective because response signal is not generated and thus, a radio wave is not transmitted to the external wireless communication device 107. The functional circuit 101 which is judged as normal exchanges data with the external wireless communication device 107 as a functional circuit even after the judging process. The functional circuit 101 which is judged as defective is made not to transmit a radio wave from the external wireless communication device 107 after the judging process. In this manner, the selecting operation is completed.

Note that the plurality of functional circuits 101 preferably has an anti-collision function and responds at different timings from each other to a radio wave received from the external wireless communication device 107. For example, in the case where each of the functional circuits 101 has different identification information, the functional circuit 101 which responds can be selected in accordance with the identification information. Therefore, the functional circuits 101 can respond at different timings.

Further, in the case where there is a plurality of functional circuits 101 which is judged as normal by a judging process, it is preferable that the external wireless communication device 107 transmit a radio wave to the functional circuit 101 so that only one of the normal functional circuits 101 is operated and the other normal functional circuits 101 are stopped.

As described above, the reliability of the semiconductor device of this embodiment mode can be increased by providing a plurality of functional circuits so that the semiconductor device can be operated if at least any one of the functional circuits is normal.

Further, in the semiconductor device of this embodiment mode, any of normal functional circuits can be selected and used. Accordingly, for example, the judging process is performed before shipping so that defective functional circuits can be figured out in advance, and only normal functional circuits can be used.

(Embodiment Mode 2)

In this embodiment mode, another structure of a semiconductor device according to one aspect of the invention disclosed in this specification will be described.

First, a structure of a functional circuit in the semiconductor device according to one aspect of the invention disclosed in this specification will be described with reference to FIG. 4.

Figure 4:
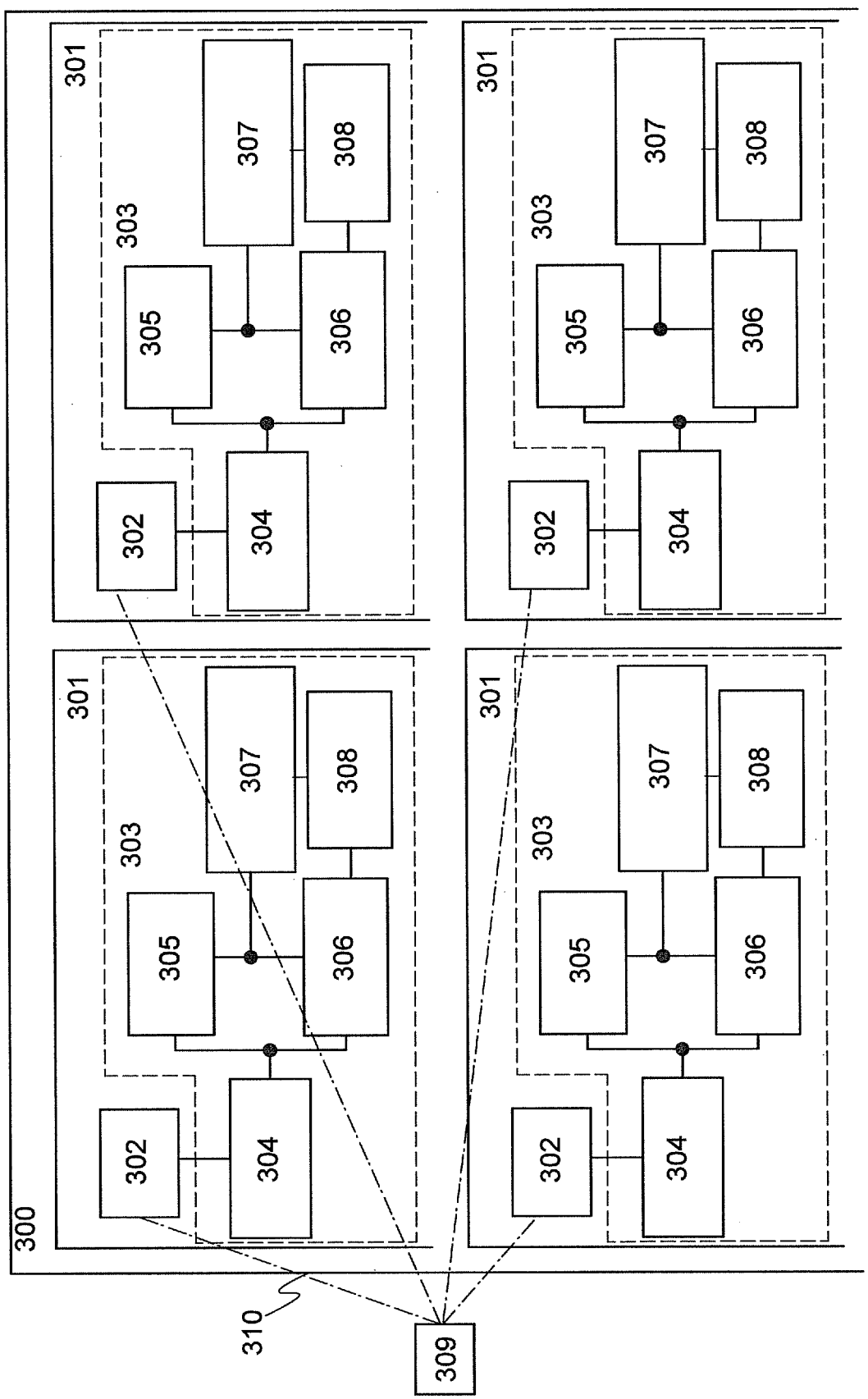
FIG. 4 is a block diagram illustrating a structure of a semiconductor device in Embodiment Mode 2.

FIG. 4 is a block diagram illustrating a structure of a functional circuit in this embodiment mode.

As shown in FIG. 4, a semiconductor device 300 in this embodiment mode includes a plurality of functional circuits 301, and the functional circuits 301 each include an antenna 302, a semiconductor integrated circuit 303 electrically connected to the antenna 302.

The functional circuit 301 has functions of generating power supply voltage by using a radio wave (a carrier wave or the like) received at the antenna 302 and operating by using the power supply voltage in accordance with a command of a signal in the radio wave received at the antenna 302. In addition, the plurality of functional circuits 301 has the same function and functions as redundant circuits which are capable of performing the same operation.

In addition, the plurality of functional circuits 301 has identification information different from each other. The different identification information can be generated by using a difference in the positions of the respective functional circuits 301, a difference in the amount of time for transmission or reception of signals, or a difference in the frequency of response signals, or the like.

The antenna 302 has a function of exchanging data by transmission/reception of radio waves to/from an external wireless communication device 309 or the like. For example, the functional circuit 301 can transmit a signal generated in the functional circuit 301 to the external wireless communication device 309 via the antenna 302 by a radio wave 310. In addition, by using an on-chip antenna as the antenna 302 by way of example, contact failure between the antenna and the semiconductor integrated circuit can be suppressed.

Note that the frequency of a radio wave used between the external wireless communication device 309 and the semiconductor device 300 is preferably 30 MHz or more and 5 GHz or less. For example, a frequency band of 950 MHz, 2.45 GHz, or the like may be employed.

In addition, as a transmission method of a signal, which is applied to the antenna 302, for example, an electromagnetic coupling method, an electromagnetic induction method, a microwave method, or the like can be used in accordance with the frequency of the signal. A transmission method can be selected as appropriate in consideration of use application, and an antenna with the optimal length or shape may be provided in accordance with the transmission method.

The semiconductor integrated circuit 303 is a circuit in which a plurality of semiconductor elements is brought together in order to obtain a particular function. As a semiconductor element, for example, one or some of a transistor, a diode, a resister element, and a capacitor element can be used as appropriate.

Note that the plurality of functional circuits 301 are preferably covered with one sealing layer. By covering the plurality of functional circuits 301 with one sealing layer, mixing of impurities such as water from the outside can be suppressed, and resistance to external force can be increased. As the sealing layer, for example, a material formed of fibrous bodies impregnated with resin, (for example, prepreg) or the like can be used.

Further, the semiconductor integrated circuit 303 includes a transmission/reception circuit 304 electrically connected to the antenna 302, a power supply circuit 305 and a logic circuit 306 which are electrically connected to the transmission/reception circuit 304, a power supply control circuit 307 electrically connected to the power supply circuit 305 and the logic circuit 306, and a judging circuit 308 electrically connected to the power supply control circuit 307. However, not being limited to the above-described structure, the semiconductor integrated circuit 303 may employ a structure to which another circuit is added.

The transmission/reception circuit 304 has functions of generating a signal from a radio wave received at the antenna 302, and outputting the signal to the power supply circuit 305 and the logic circuit 306. The transmission/reception circuit 304 is formed of, for example, a rectifier circuit, a modulation circuit, a demodulation circuit, and the like.

The power supply circuit 305 has a function of generating power supply voltage from a signal generated in the transmission/reception circuit 304. The generated power supply voltage is output to the logic circuit 306.

The logic circuit 306 has a function of performing predetermined operation in accordance with the content of a command of a signal in a radio wave received at the antenna 302, with the power supply voltage supplied from the power supply circuit 305. A memory circuit is provided in the logic circuit 306, and data (identification information or the like) for performing operation in accordance with the command of the signal in the radio wave received at the antenna 302 is written to the memory circuit.

The power supply control circuit 307 has a function of controlling whether the power supply circuit 305 is to be operated or not.

The judging circuit 308 includes at least a memory circuit, and data of High or Low is written to the memory circuit in accordance with whether the logic circuit 306 normally operates or not. Note that, "Low" in this specification means a state of ground potential or low potential that is equal or substantially equal to the ground potential. "High" means a state of higher potential than Low and can be set at a predetermined value.

As the memory circuit for the logic circuit 306 and the judging circuit 308, for example, a non-volatile memory or a volatile memory can be used. As the memory circuit, a DRAM (dynamic random access memory), an SRAM (static random access memory), an FeRAM, a mask ROM, an EPROM (electrically programmable read only memory), an EEPROM (electrically erasable and programmable read only memory), a flash memory, an organic memory, an inorganic memory, or the like can be used, for example. For example, in the case where a memory which is not capable of rewriting data is used, the written data of High or Low can be kept even after shipping. On the other hand, in the case where a memory which is capable of rewriting data is used, whether a functional circuit is defective or not can be judged and data of High or Low, which is already written, can be rewritten even after shipping.

In the semiconductor device of this embodiment mode, whether each of the plurality of functional circuits 301 with the above-described structure is normal or not is judged. Among the plurality of functional circuits 301 which is judged, any one of the normal functional circuits 301 exchanges data with the external wireless communication device 309 even after the judgment.

Figure 5:
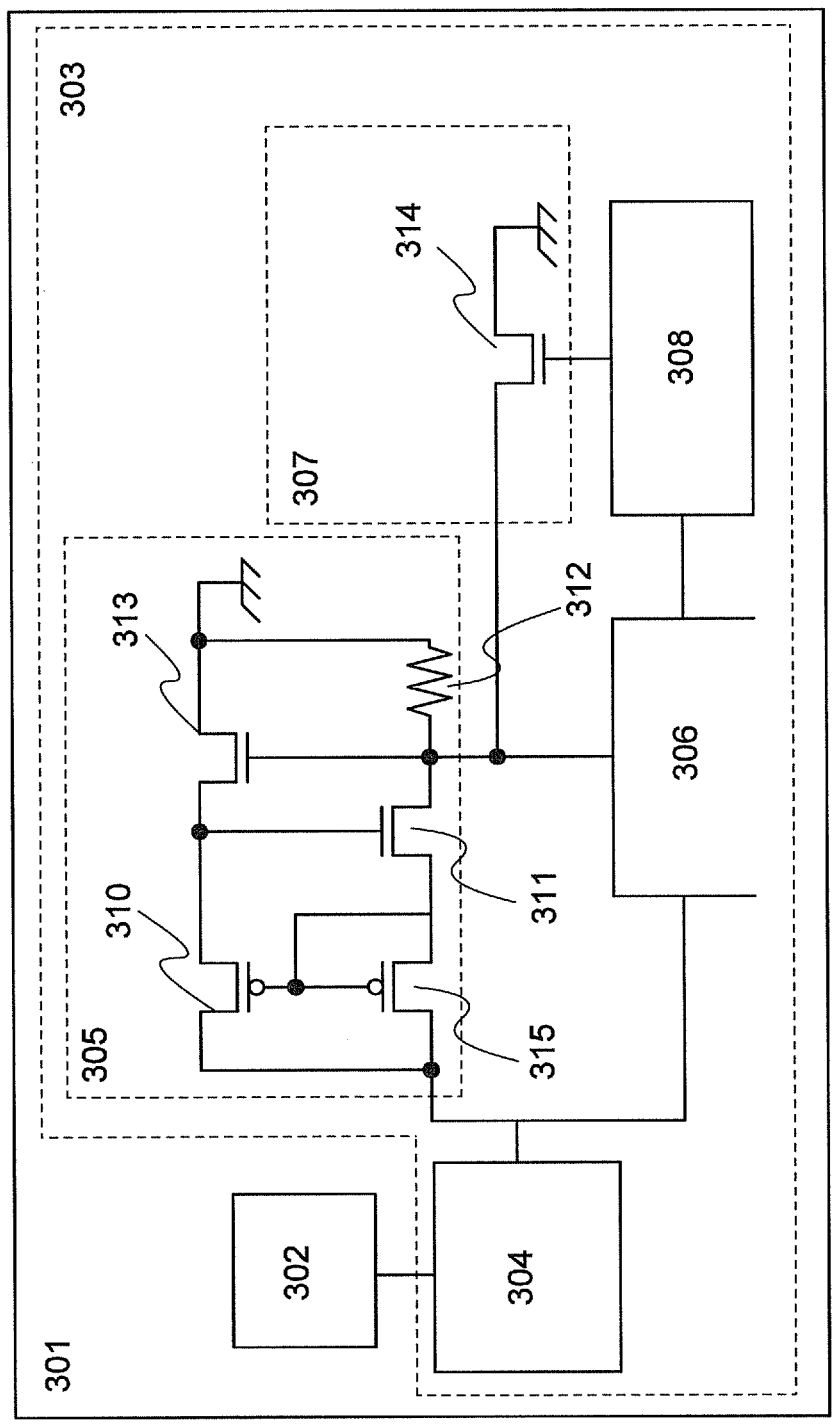
FIG. 5 is a block diagram illustrating a structure of a functional circuit in a semiconductor device in Embodiment Mode 2.

Further, a specific structure of the semiconductor device of this embodiment mode will be described with reference to FIG. 5. FIG. 5 is a diagram illustrating a structure of a functional circuit in the semiconductor device of this embodiment mode.

As shown in FIG. 5, the functional circuit 301 in the semiconductor device of this embodiment mode includes the antenna 302, the transmission/reception circuit 304 electrically connected to the antenna 302, the power supply circuit 305 and the logic circuit 306 which are electrically connected to the transmission/reception circuit 304, the power supply control circuit 307 electrically connected to the power supply circuit 305 and the logic circuit 306, and the judging circuit 308 electrically connected to the power supply control circuit 307.

The antenna 302, the transmission/reception circuit 304, the logic circuit 306, and the judging circuit 308 have the same structures or functions as those shown in FIG. 4.

The power supply circuit 305 includes a transistor 315, a transistor 310, a transistor 311, a resistor element 312, and a transistor 313.

The transistor 315 includes a gate terminal, a source terminal, and a drain terminal. The gate terminal is electrically connected to one of the source terminal and the drain terminal, and the other of the source terminal and the drain terminal is electrically connected to the transmission/reception circuit 304.

A gate terminal of the transistor 310 is electrically connected to the gate terminal of the transistor 315, and one of a source terminal and a drain terminal of the transistor 310 is electrically connected to the transmission/reception circuit 304.

A gate terminal of the transistor 311 is electrically connected to the other of the source terminal and the drain terminal of the transistor 310; one of a source terminal and a drain terminal of the transistor 311 is electrically connected to the one of the source terminal and the drain terminal of the transistor 315; and the other of the source terminal and the drain terminal of the transistor 311 is electrically connected to the logic circuit 306 and the power supply control circuit 307.

One terminal of the resistor element 312 is electrically connected to the other of the source terminal and the drain terminal of the transistor 311, and the other terminal of the resistor element 312 is grounded.

A gate terminal of the transistor 313 is electrically connected to the logic circuit 306, the power supply control circuit 307, the other of the source terminal and the drain terminal of the transistor 311, and the one terminal of the resistor element 312. One of a source terminal and a drain terminal of the transistor 313 is grounded, and the other of the source terminal and the drain terminal of the transistor 313 is electrically connected to the other of the source terminal and the drain terminal of the transistor 310 and the gate terminal of the transistor 311.

Note that in FIG. 5, although the transistor 315 and the transistor 310 are p-channel transistors and the transistor 311 and the transistor 313 are n-channel transistors, the semiconductor device of this invention is not limited thereto. As long as the same operation as the power supply circuit 305 shown in FIG. 5 can be performed, transistors having different conductive types can be used. Further, not being limited to the structure shown in FIG. 5, the power supply circuit 305 may be formed of another element and the like.

The power supply control circuit 307 includes a transistor 314 having a gate terminal, a source terminal, and a drain terminal. The gate terminal of the transistor 314 is electrically connected to the judging circuit 308, one of the source terminal and the drain terminal is electrically connected to the power supply circuit 305 and the logic circuit 306, and the other of the source terminal and the drain terminal is grounded. Note that the structure of the power supply control circuit 307 is not limited to the structure shown in FIG. 5, and may include another element.

Figure 6:
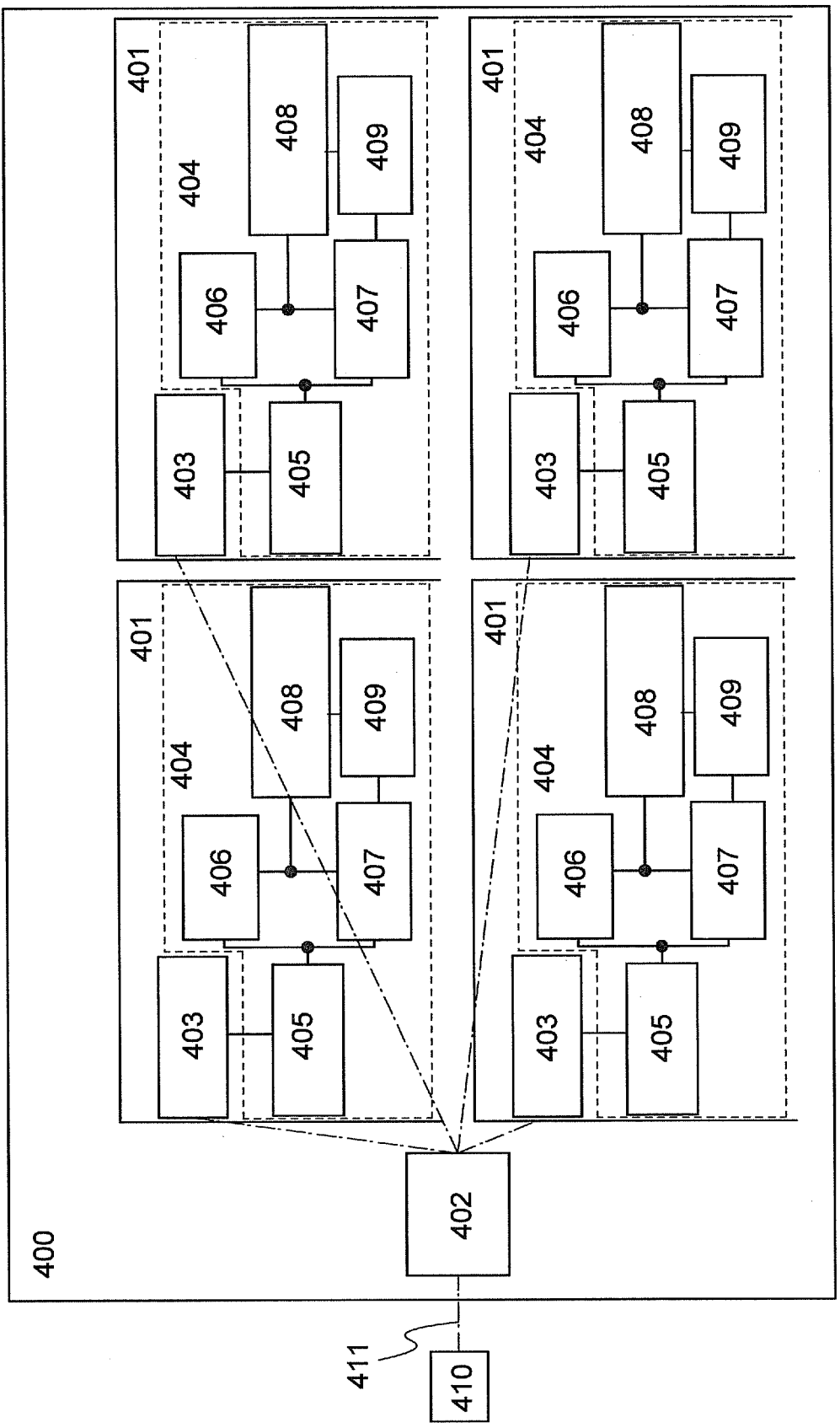
FIG. 6 is a block diagram illustrating another structure of the semiconductor device in Embodiment Mode 2.

Further, in this embodiment mode, a booster antenna besides the antenna provided in the functional circuit may be provided to the semiconductor device. A structural example of the semiconductor device provided with the booster antenna will be described with reference to FIG. 6. FIG. 6 is a block diagram illustrating another structure of the semiconductor device in this embodiment mode.

A semiconductor device 400 of this embodiment mode shown in FIG. 6 includes a plurality of functional circuits 401 and a first antenna 402. The functional circuits 401 each include a second antenna 403 and a semiconductor integrated circuit 404 electrically connected to the second antenna 403.

Further, the semiconductor integrated circuit 404 includes a transmission/reception circuit 405 electrically connected to the second antenna 403, a power supply circuit 406 and a logic circuit 407 which are electrically connected to the transmission/reception circuit 405, a power supply control circuit 408 electrically connected to the power supply circuit 406 and the logic circuit 407, and a judging circuit 409 electrically connected to the logic circuit 407 and the power supply control circuit 408.

The semiconductor integrated circuit 404 corresponds to the semiconductor integrated circuit 303 in FIG. 4. Descriptions of the structure and a function of the semiconductor integrated circuit 404 are incorporated in those of the semiconductor integrated circuit 303.

In addition, the transmission/reception circuit 405, the power supply circuit 406, the logic circuit 407, the power supply control circuit 408, and the judging circuit 409 correspond to the transmission/reception circuit 304, the power supply circuit 305, the logic circuit 306, the power supply control circuit 307, and the judging circuit 308 in FIG. 4, respectively. Descriptions of functions of the circuits are incorporated in those of the transmission/reception circuit 304, the power supply circuit 305, the logic circuit 306, the power supply control circuit 307, and the judging circuit 308.

The second antenna 403 corresponds to the antenna 302 shown in FIG 4. The first antenna 402 is also referred to as a booster antenna and can transmit and receive a signal by magnetic field coupling with the second antenna 403. Moreover, the first antenna 402 has a function of exchanging data with, for example, the external wireless communication device 410 by transmission/reception of a radio wave 411. For example, when a radio wave is transmitted from the external wireless communication device 410 to the first antenna 402, alternating current is generated in the first antenna 402, and a magnetic field is generated in the vicinity of the first antenna 402. Thus, an induced electromotive force is generated in the second antenna 403 by magnetic field coupling between the first antenna 402 and the second antenna 403. The functional circuit 401 operates with the induced electromotive force and is capable of transmission/reception of the radio wave 411 via the first antenna 402. In addition, in the case where a radio wave is transmitted from the functional circuit 401 to the external wireless communication device 410, in accordance with a signal generated in the functional circuit 401, the second antenna 403 is magnetic-field coupled with the first antenna 402 by applying current to the second antenna 403. Induced electromotive force is generated in the first antenna 402 magnetic-field coupled with the second antenna 403, and the radio wave is transmitted to the external wireless communication device 410 via the first antenna 402.

As described above, since the semiconductor device of this embodiment mode employs the structure in which a booster antenna is provided besides an antenna in a functional circuit, a frequency band of receivable radio waves is not restricted, whereby a communication distance can be extended.

Next, selecting operation of a functional circuit in a semiconductor device of this embodiment mode will be described. Here, supposing that the structure of the semiconductor device is that shown in FIG. 4 and that the structure of the functional circuit 301 is that shown in FIG. 5 by way of example, the selecting operation will be described.

Since the selecting operation of the functional circuit is the same as that described in Embodiment Mode 1, the selecting operation of the functional circuit will be described by referring to the flow chart shown in FIG. 3 as appropriate. First, a judging process is performed in the power supply circuit 305 to judge whether each of the functional circuits 301 is normal or not.

Note that, at that time, the plurality of functional circuits 301 preferably has an anti-collision function and responds at different timings from each other to a radio wave received from the external wireless communication device 309. For example, in the case where each of the functional circuits 301 has different identification information, the functional circuit which responds can be selected in accordance with the identification information. Therefore, the functional circuits 301 can respond at different timings.

Next, a process for judging whether the logic circuit 306 is normal or not will be performed.

Figure 7:
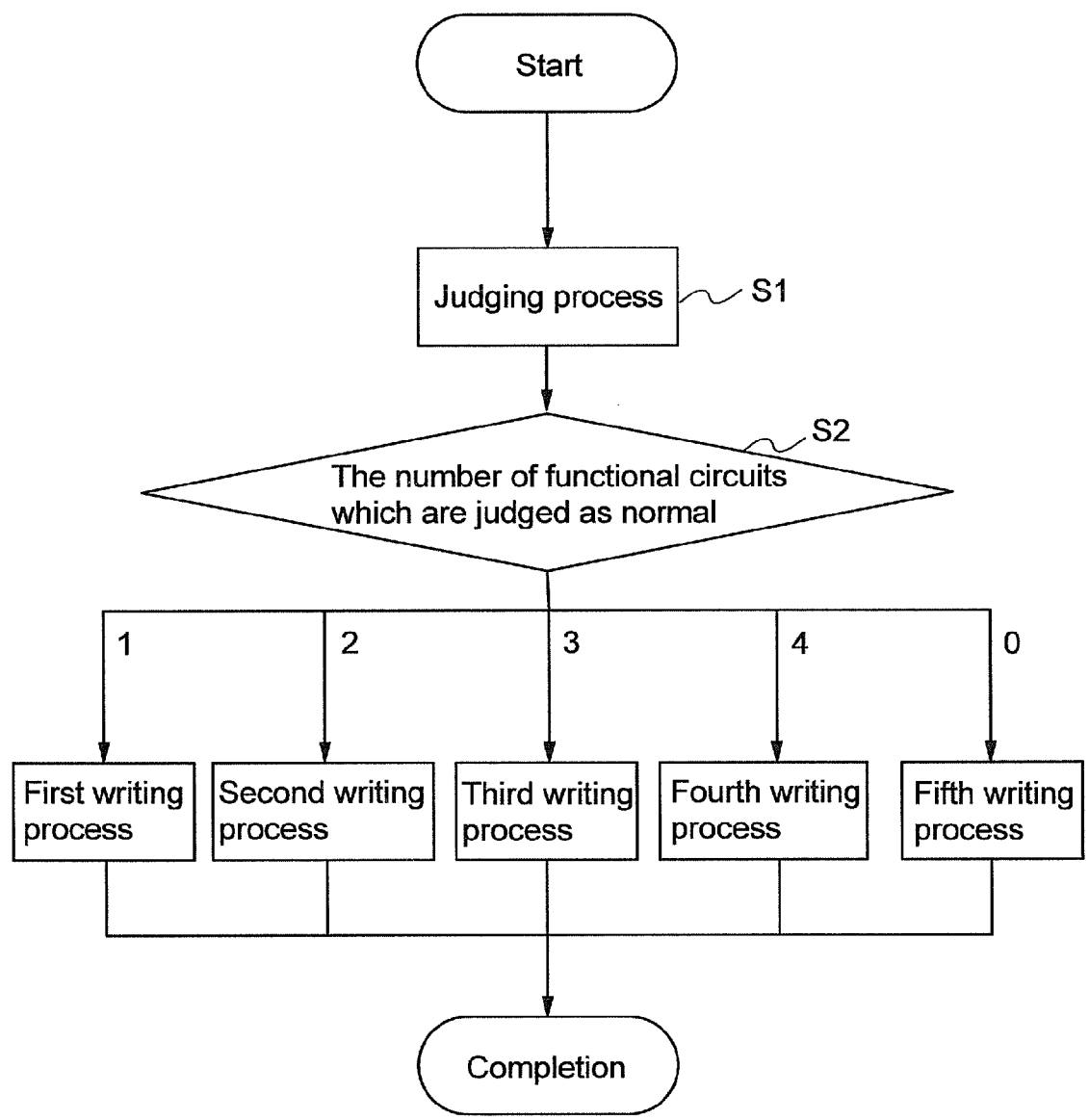
FIG. 7 is a flow chart illustrating selecting operation of a functional circuit in a semiconductor device in Embodiment Mode 2.

The judging process for the logic circuit 306 will be described with reference to FIG. 7. FIG. 7 is a flow chart illustrating a judging process for the logic circuit in the semiconductor device of this embodiment mode.

As shown in FIG. 7, as a first step (S1 in FIG. 7) after the start, a judging process is performed. A specific method of the judging process will be described below.

For example, in the case where a judging process is performed in the logic circuit 306 in the functional circuit 301 which is selected at will, when the logic circuit 306 is judged as normal, data (High in this embodiment mode) which indicates that the logic circuit 306 is normal is written to the memory circuit in the judging circuit 308, and when the logic circuit 306 is judged as defective, data (Low in this embodiment mode) which indicates that the logic circuit 306 is defective is written to the memory circuit in the judging circuit 308.

Note that as a method for the judging process at that time, a method for judging whether the logic circuit 306 operates or not by transmitting a radio wave from the external wireless communication device or the like to the functional circuit 301 if the power supply circuit 305 is normal can be employed. Further, in the case of a step before shipping, for example, a method for judging whether the logic circuit 306 operates or not by applying power supply voltage to the logic circuit 306 from the outside with the use of a prober or the like may be employed.

When data which indicates defective is written to the memory circuit in the judging circuit 308, the transistor 314 in the power supply control circuit 307 is turned on, and ground potential is applied to the power supply circuit 305 via the transistor 314. Accordingly, the power supply circuit 305 stops, whereby generation of power supply voltage stops. Therefore, the functional circuit 301 becomes unable to operate.

As described above, among the plurality of functional circuits 301, if any of them which is selected is judged as defective, the above-described judging process is performed in another functional circuit 301 which has not been selected yet. Accordingly, for example, in the case where the power supply circuit 305 and the logic circuit 306 are judged as normal and defective, respectively, which are in one functional circuit 301, the functional circuit 301 can be stopped, whereby malfunction of the functional circuit 301 having the logic circuit 306 which is judged as defective can be prevented.

Further, as a second step (S2 in FIG. 7), any one of a first writing process to a fifth writing process is performed in accordance with the number of functional circuits 301 which are judged as normal in the judging process for the logic circuit 306. Each writing process will be described below.

In the case where the number of functional circuits 301 judged as normal is one, as the first writing process, data which means normal is written to the memory circuit in the judging circuit 308 in the functional circuit 301 judged as normal. The functional circuit 301 to which the normal data is written exchanges data with the outside (the external wireless communication device 309 or the like) even after the judging process.

In the case where the number of functional circuits 301 judged as normal is two, as the second writing process, data which indicates normal is written to the memory circuit in the judging circuit 308 in one of the functional circuits 301 judged as normal, and data (Low in this embodiment mode) which indicates stopping is written to the memory circuit in the judging circuit 308 in the other of the functional circuits 301 judged as normal. The functional circuit 301 to which the data which indicates stopping is written stops and only the functional circuit 301 to which the data which indicates normal is written exchanges data with the outside (the external wireless communication device 309 or the like) even after the judging process.

In the case where the number of functional circuits 301 judged as normal is three, as the third writing process, data which indicates normal is written to the memory circuit in the judging circuit 308 in any one of the functional circuits 301 judged as normal, and data (Low in this embodiment mode) which indicates stopping is written to the memory circuits in the judging circuits 308 in the other functional circuits 301. The functional circuits 301 to which the data which indicates stopping is written stop and only the functional circuit 301 to which the data which indicates normal is written exchanges data with the outside (the external wireless communication device 309 or the like) even after the judging process.

In the case where the number of functional circuits 301 judged as normal is four, as the fourth writing process, data which indicates normal is written to the memory circuit in the judging circuit 308 in any one of the functional circuits 301 judged as normal, and data (Low in this embodiment mode) which indicates stopping is written to the memory circuits in the judging circuits 308 in the other functional circuits 301 judged as normal. The functional circuits 301 to which the data which indicates stopping is written stop and only the functional circuit 301 to which the data which indicates normal exchanges data with the outside (the external wireless communication device 309 or the like) even after the judging process.

Note that, in this embodiment mode, data which indicates normal may be set as Low, and data which indicates defective or stopping may be set as High. Alternatively, a state of potential except High and Low can be used as data which indicates normal, defective, or stopping.

In the case where the number of functional circuits 301 judged as normal is zero, as the fifth writing process, data which indicates defective is written to the memory circuits in the judging circuits 308 in all the functional circuits 301. In that case, among the plurality of functional circuits 301, a judging process is not necessary for the functional circuit 301 which is judged last.

By performance of any of the above-described writing processes, the selecting operation is completed.

In this manner, by providing a plurality of functional circuits, the reliability of the semiconductor device of this embodiment mode can be increased because operation is possible as long as any one of the functional circuits is normal.

In addition, in the semiconductor device of this embodiment mode, by performing selecting operation through a judging process in each functional circuit, a normal functional circuit can be selected to be used. Accordingly, for example, the above-described judging operation is performed before shipping, and a defective functional circuit is figured out in advance, so that only a normal functional circuit can be used. In addition, in the case where there are a plurality of normal functional circuits, any one of the normal functional circuits can be selected to be used, whereby power consumption can be reduced.

(Embodiment Mode 3)

In this embodiment mode, one structural example of a semiconductor device according to one aspect of this invention disclosed in this specification will be described.

Figure 8A:
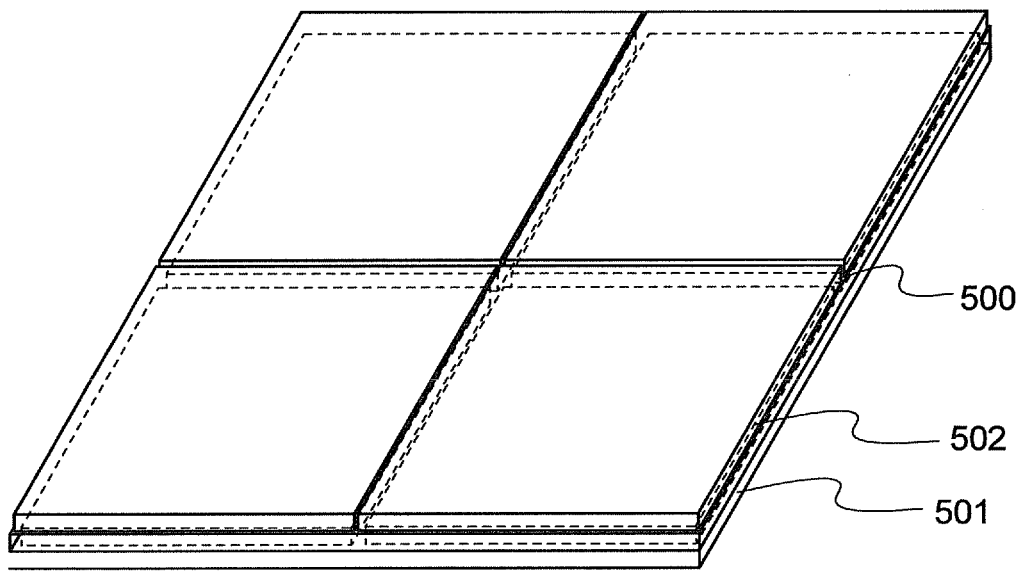
FIGS. 8A and 8B are perspective views illustrating a structure of a semiconductor device in Embodiment Mode 3.
Figure 8B:
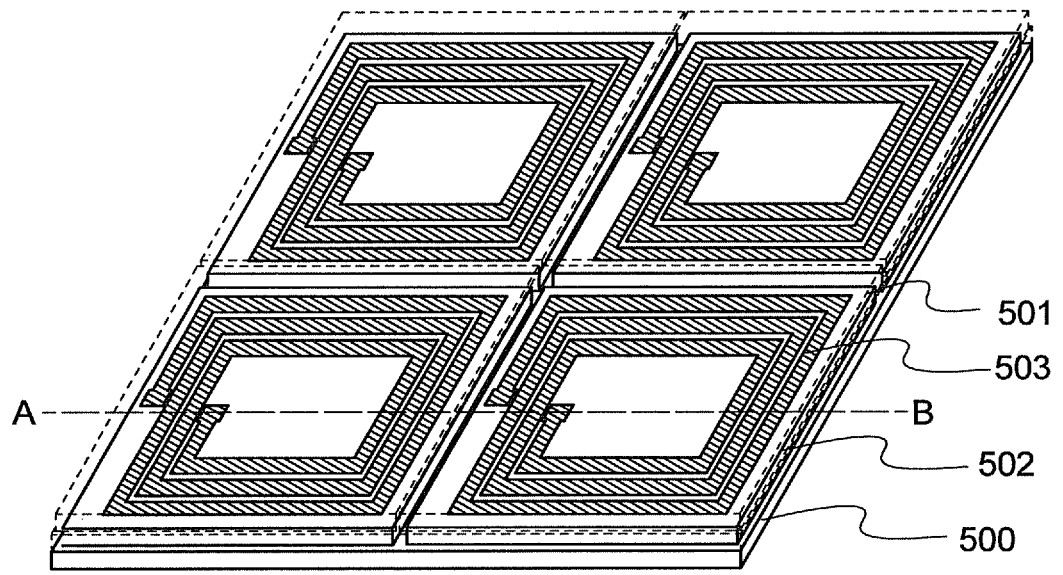

First, one structural example of a semiconductor device in this embodiment mode will be described with reference to FIGS. 8A and 8B. FIGS. 8A and 8B are perspective views illustrating one structural example of the semiconductor device in this embodiment mode.

As shown in FIG. 8A, the semiconductor device in this embodiment mode includes sealing layers 500, a sealing layer 501, and a plurality of functional circuits 502 (dashed line portions) which is covered with the sealing layers 500 and 501.

In addition, FIG. 8B is a diagram in which the plurality of functional circuits 502 in FIG. 8A is shown by a solid line, and the sealing layers 500 are shown by a dashed line for the sake of convenience. As shown in FIG. 8B, the plurality of functional circuits 502 which is covered with the sealing layers 500 (dashed line portions) and the sealing layer 501 includes antennas 503 each formed over the functional circuit 502.

Figure 9:
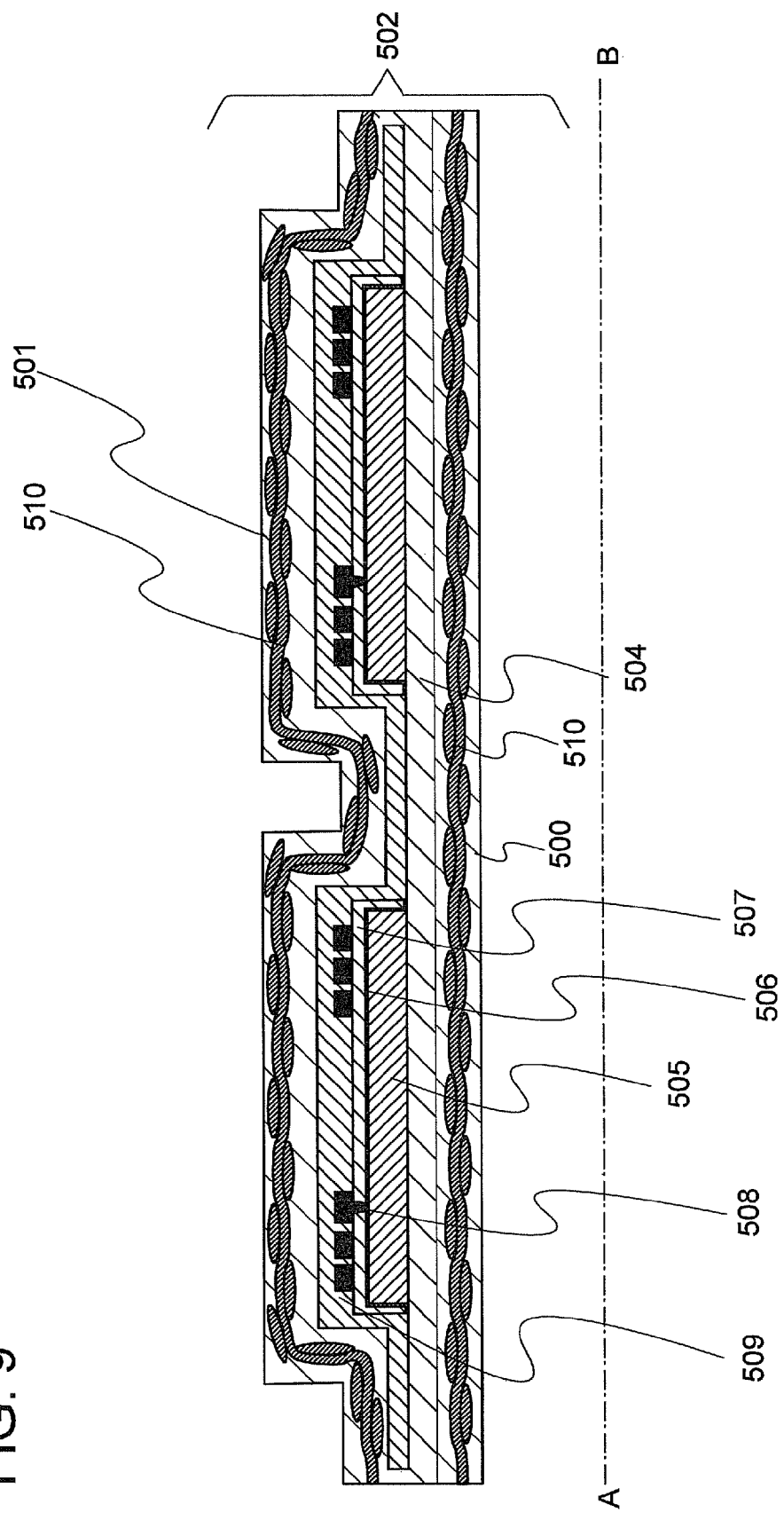
FIG. 9 is a cross-sectional view illustrating a structure of a semiconductor device in Embodiment Mode 3.

Next, a cross-sectional structure of the semiconductor device in this embodiment mode will be described with reference to FIG. 9. FIG. 9 is a cross-sectional view of FIG. 8B along line A-B.

As shown in FIG. 9, the semiconductor device in this embodiment mode includes the plurality of functional circuits 502 each including the sealing layer 500, a separation layer 504 provided over the sealing layer 500, a semiconductor element layer 505 provided over the separation layer 504, a first insulating layer 506 and a second insulating layer 507 which are provided over the semiconductor element layer 505 and have an opening portion, a conductive layer 508 part of which is in contact with the semiconductor element layer 505 through the opening portion, a third insulating layer 509 provided so as to cover the conductive layer 508 and the second insulating layer 507, and the sealing layer 501 provided over the third insulating layer 509.

The sealing layer 500 is a first sealing layer, and the sealing layer 501 is a second sealing layer. The sealing layers 500 and 501 are in contact with each other in their edge portions, and the separation layer 504, the semiconductor element layer 505, the first insulating layer 506, the second insulating layer 507, the conductive layer 508, and the third insulating layer 509 are covered with one sealing layer including the sealing layers 500 and 501. As the sealing layers 500 and 501, for example, a material in which a fibrous body 510 or the like is impregnated with resin, such as prepreg, can be used as shown in FIG. 9. At that time, the fibrous body 510 is a woven fabric or a nonwoven fabric using a high-strength fiber of an organic compound or an inorganic compound. The high-strength fiber is specifically fiber with a high elastic modulus in tension or fiber with a high Young's modulus. As typical examples of the high-strength fiber, polyvinyl alcohol fiber, polyester fiber, polyamide fiber, polyethylene fiber, aramid fiber, polyparaphenylene benzobisoxazole fiber, glass fiber, carbon fiber, and the like can be given. As the glass fiber, a glass fiber using E glass, S glass, D glass, Q glass, or the like can be used. It is to be noted that the fibrous body 510 may be formed from one kind of the above-described high-strength fibers or a plurality of the above-described high-strength fibers.

When a carbon fiber is used as the fibrous body 510 to make the fibrous body 510 electrically conductive, electrostatic discharge can be reduced.

The fibrous body 510 may be formed using a woven fabric which is woven using bundles of fibers (single yarn) (hereinafter, referred to as yarn bundles) for warp yarns and weft yarns, or a nonwoven fabric obtained by stacking yarn bundles of plural kinds of fibers in a random manner or in one direction. In the case of a woven fabric, a plain-woven fabric, a twilled fabric, a satin-woven fabric, or the like can be used.

The yarn bundle may have a circular shape or an elliptical shape in cross section. As the yarn bundle of fibers, a yarn bundle of fibers may be used which has been subjected to fiber opening with a high-pressure water stream, high-frequency vibration using liquid as a medium, continuous ultrasonic vibration, pressing with a roller, or the like. A yarn bundle of fibers which is subjected to fabric opening has a large width, has a smaller number of single yarns in the thickness direction, and has an elliptical shape or a flat shape in its cross section. Further, by using a loosely twisted yarn as the yarn bundle of fibers, the yarn bundle is easily flattened and has an elliptical shape or a flat shape in cross section. Use of a yarn bundle having an elliptical shape or a flat shape in its cross section as described above can make the fibrous body 510 thin. Accordingly, the sealing layers 500 and 501 can be made thinner, and thus, a thin semiconductor device can be manufactured. The diameter of the yarn bundle of fibers may be 4 μm or more and 400 μm or less, preferably, 4 μm or more and 200 μm or less. The thickness of the fiber may be 4 μm or more and 20 μm or less. However, the fiber may be further thinned depending on a material of the fiber, and the thickness of the fiber may be set as appropriate in accordance with the kind of the material to be used for the fiber.

Figure 10A:
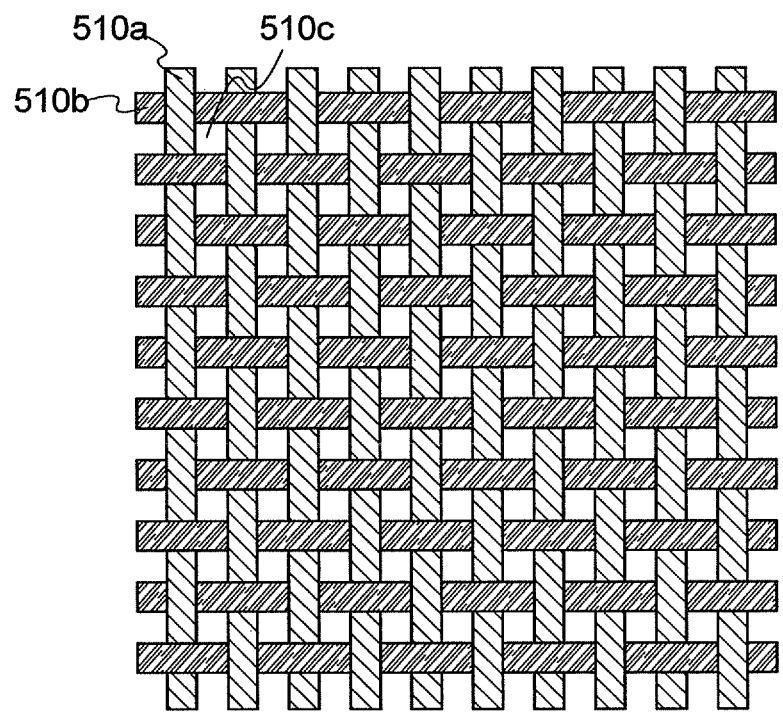
FIGS. 10A and 10B are top views illustrating a woven fabric in Embodiment Mode 3.
Figure 10B:
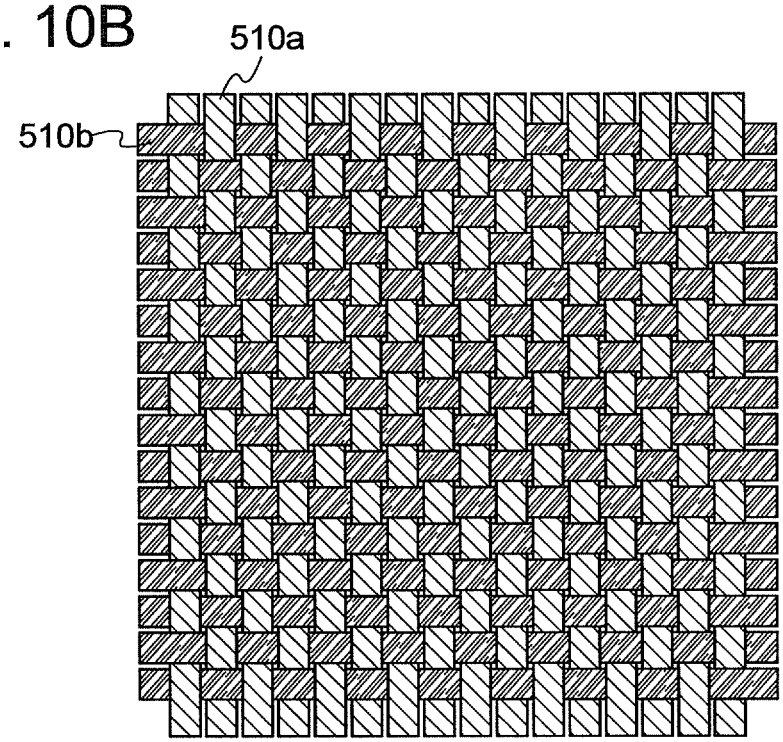

FIGS. 10A and 10B each show a top view of a woven fabric as the fibrous body 510 which is woven using yarn bundles for warp yarns and weft yarns.

As shown in FIG. 10A, the fibrous body 510 is woven using warp yarns 510*a* spaced at regular intervals and weft yarns 510*b* spaced at regular intervals. Such fibrous body has a region without the warp yarns 510*a* and the weft yarns 510*b* (referred to as a basket hole 510*c*). In such a fibrous body 510, the fibrous body is further impregnated with an organic resin, whereby adhesiveness between the fibrous body 510 and the element layer can be further increased.

As shown in FIG. 10B, in the fibrous body 510, the density of the warp yarns 510*a* and the weft yarns 510*b* may be high and the proportion of the basket hole 510*c* may be low. Typically, the size of the basket hole 510*c* is preferably smaller than the area of a locally pressed portion. More typically, the basket hole 510*c* preferably has a rectangular shape having a side with a length greater than or equal to 0.01 mm and less than or equal to 0.2 mm. When the basket hole 510*c* of the fibrous body 510 has such a small area, even when pressure is applied by a member with a sharp tip (typically, a writing material such as a pen or a pencil), the pressure can be absorbed in the entire fibrous body 510.

Further, in order to enhance permeability of an organic resin into the inside of the yarn bundle, the yarn bundle may be subjected to surface treatment. For example, as the surface treatment, corona discharge, plasma discharge, or the like for activating a surface of the yarn bundle can be given. Further, surface treatment using a silane coupling agent or a titanate coupling agent can be given.

As the resin with which the fibrous body 510 is impregnated and the surface of the semiconductor element layer 505 is sealed, a thermosetting resin such as an epoxy resin, an unsaturated polyester resin, a polyimide resin, a bismaleimide-triazine resin, or a cyanate resin can be used. Further, a thermoplastic resin such as a polyphenylene oxide resin, a polyetherimide resin, or a fluorine resin can be used. Furthermore, a UV curable resin or an organic plastic resin can be used. Furthermore, a plurality of the above-described thermosetting resins and thermoplastic resins may be used. When the above-described resin is used, the fibrous body 510 can be firmly fixed to the semiconductor element layer 505 by thermal treatment. The higher the glass transition temperature of the resin becomes, the harder it becomes to break the resin by local pressure, which is preferable.

The thickness of each of the sealing layers 500 and 501 is preferably 10 μm or more and 100 μm or less, more preferably 10 μm or more and 30 μm or less. By using a sealing layer with such a thickness, a thin semiconductor device capable of being bent can be manufactured.

Highly thermally-conductive filler may be dispersed in the resin or the yarn bundle of the fibrous body 510. As the highly thermally-conductive filler, an aluminum nitride, a bromine nitride, a silicon nitride, alumina, or the like can be given. As the highly thermally-conductive filler, a metal particle such as silver or copper can also be given. When the conductive filler is included in the organic resin or the fiber yarn bundle, heat generated in the element layer can be easily released to the outside. Accordingly, thermal storage of the semiconductor device can be suppressed, and breakdown of the semiconductor device can be reduced.

Alternatively, carbon particles may be dispersed in the resin or the yarn bundle of the fibrous body 510. In particular, when a thin film transistor is included in the semiconductor element layer 505, the sealing layers 500 and 501 including the resin or the fibrous body 510 in which the carbon particles are dispersed is provided below the TFT, the TFT can be prevented from being broken by static electricity.

The separation layer 504 functions as a layer for separating the semiconductor element layer 505 which is to be provided over a different substrate from a substrate for forming the semiconductor element layer 505. The separation layer 504 may be formed of a single layer or a plurality of layers stacked using any one or more layers formed of an element selected from tungsten, molybdenum, titanium, tantalum, niobium, nickel, cobalt, zirconium, zinc, ruthenium, rhodium, palladium, osmium, iridium, silicon, or the like, an alloy material containing the above-described element as its main component, or/and a compound material containing the above-described element as its main component.

When the separation layer 504 has a single-layer structure, it is preferably formed of a layer containing tungsten, molybdenum, or a mixture of tungsten and molybdenum. Alternatively, the separation layer 504 is formed using a layer containing an oxide of tungsten, a layer containing an oxynitride of tungsten, a layer containing an oxide of molybdenum, a layer containing an oxynitride of molybdenum, or a layer containing an oxide or an oxynitride of a mixture of tungsten and molybdenum. It is to be noted that the mixture of tungsten and molybdenum corresponds to, for example, an alloy of tungsten and molybdenum.

In the case where the separation layer 504 has a layered structure, preferably, a metal layer is formed as a first layer, and a metal oxide layer is formed as a second layer. Typically, a layer containing tungsten, molybdenum, or a mixture of tungsten and molybdenum is formed as the metal layer of the first layer. As the second layer, a layer containing an oxide of tungsten, molybdenum, or a mixture of tungsten and molybdenum; a nitride of tungsten, molybdenum, or a mixture of tungsten and molybdenum; an oxynitride of tungsten, molybdenum, or a mixture of tungsten and molybdenum; or a nitride oxide of tungsten, molybdenum, or a mixture of tungsten and molybdenum is formed.

In the case where the separation layer 504 has a layered structure in which a metal layer is formed as the first layer and a metal oxide layer is formed as the second layer, the layered structure may be formed by utilizing the following: a layer containing tungsten is formed as the metal layer, and an insulating layer made of an oxide is formed thereover, whereby a layer containing an oxide of tungsten is formed as the metal oxide layer in the interface between the layer containing tungsten and the insulating layer. Moreover, the metal oxide layer may be formed in such a manner that the surface of the metal layer is subjected to thermal oxidation treatment, oxygen plasma treatment, treatment using a solution having strong oxidizability such as ozone water, or the like.

Examples of an oxide of tungsten include $WO_2$, $W_2O_5$, $W_4O_{11}$, $WO_3$, and the like.

The semiconductor element layer 505 is a layer in which a semiconductor integrated circuit described in Embodiment Mode 1 is formed. The semiconductor element layer 505 is preferably formed to a thickness of 1 μm or more and 10 μm or less, more preferably, 1 μm or more and 5 μm or less. When the semiconductor element layer 505 has a thickness in the above-described range, a semiconductor device capable of being bent can be formed. Moreover, the area of a top surface of the semiconductor device is preferably 4 $mm^2$ or more, more preferably 9 $mm^2$ or more.

Figure 11:
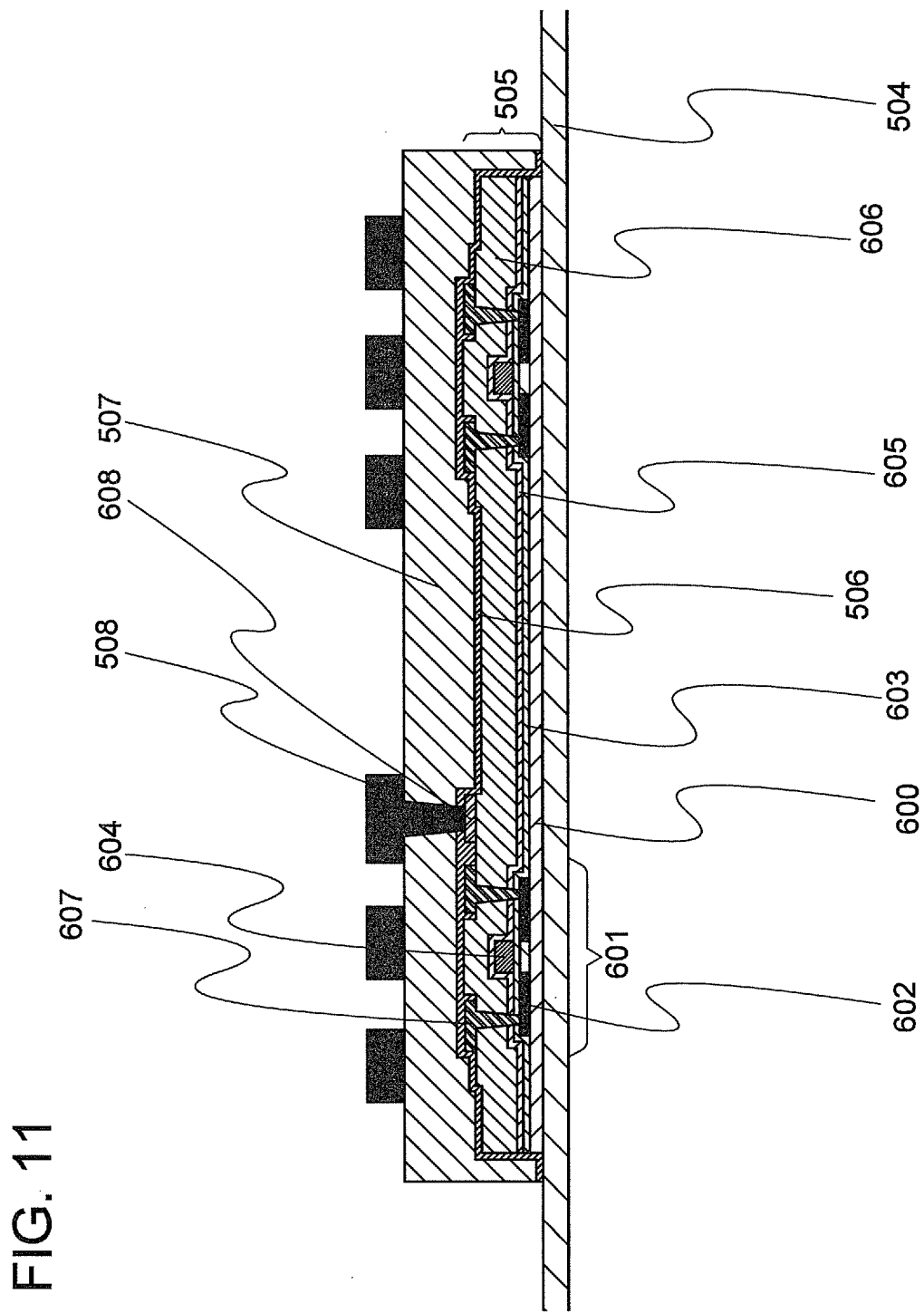
FIG. 11 is a cross-sectional view illustrating a structure of a semiconductor element layer in a semiconductor device in Embodiment Mode 3.

Here, a more specific structure of the semiconductor element layer 505 will be described with reference to FIG. 11. FIG. 11 is a cross-sectional view showing the structure of the semiconductor element layer in this embodiment mode.

As shown in FIG. 11, the semiconductor element layer 505 in this embodiment mode includes a base layer 600 and a plurality of transistors 601 provided over the base layer 600. The plurality of transistors 601 each includes a semiconductor layer 602 having impurity regions, a gate insulating layer 603 provided so as to cover the semiconductor layer 602, a gate electrode 604 provided over part of the semiconductor layer 602 with the gate insulating layer 603 interposed therebetween, a first interlayer insulating layer 605 and a second interlayer insulating layer 606 which are provided over the gate electrode 604 and the gate insulating layer 603 and have opening portions, and electrodes 607 which are provided so as to be in contact with part of the impurity region of the semiconductor layer 602 through the opening portions.

In addition, an electrode 608 provided in the same layer as the electrodes 607 of the transistor 601 is in contact with part of the conductive layer 508 through the opening portion of the first insulating layer 506 and the second insulating layer 507 in FIG. 9.

As the base layer 600, one of a silicon oxide film, a silicon oxide film containing nitrogen, a silicon nitride film, and a silicon nitride film containing oxygen; or a stacked layer of two or more of the above films may be used.

Figure 12:
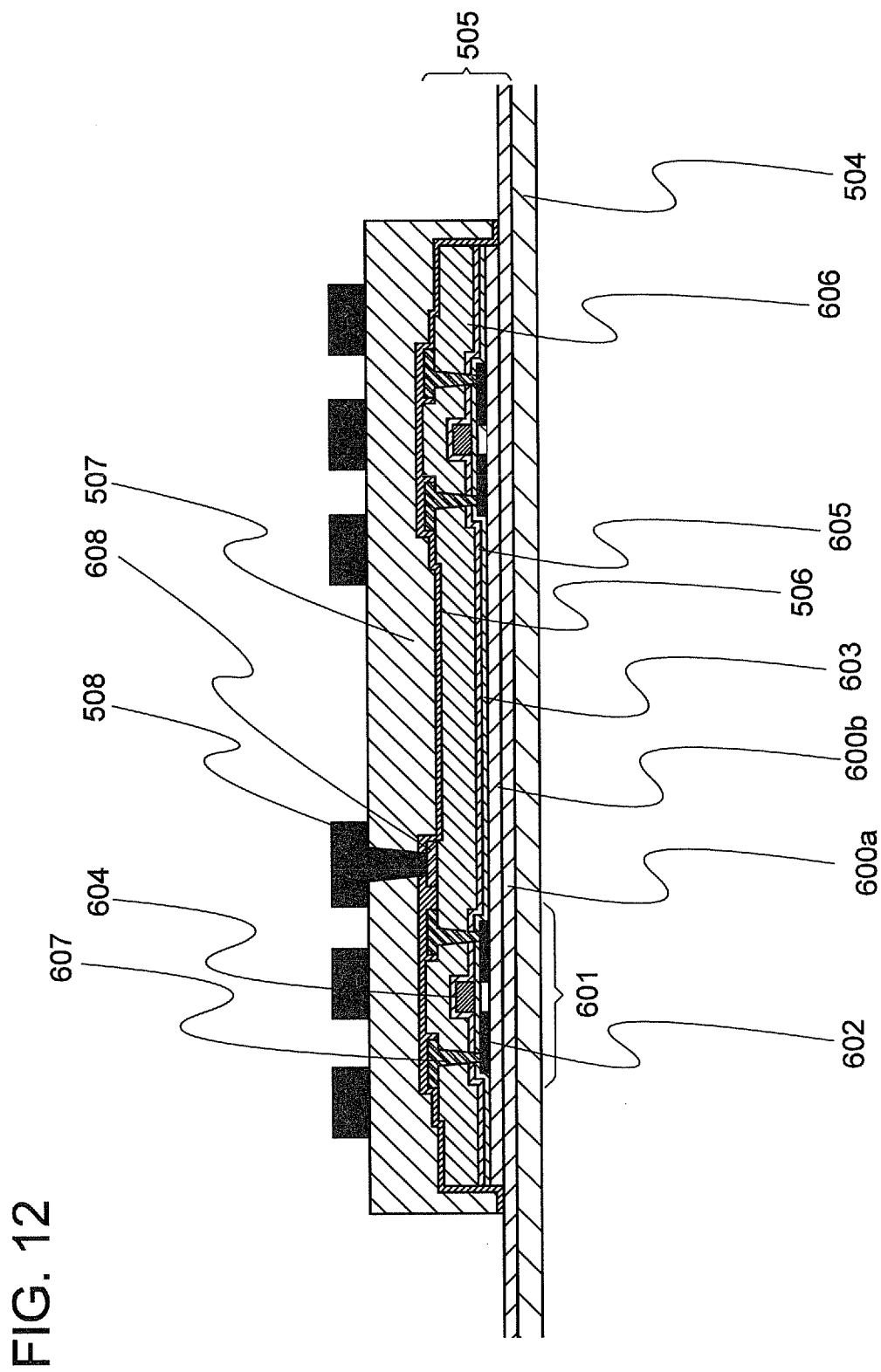
FIG. 12 is a cross-sectional view illustrating a structure of a semiconductor element layer in a semiconductor device in Embodiment Mode 3.

In addition, like the structure of the semiconductor element layer 505 shown in FIG. 12, the base layer 600 may have a two-layer structure of base layers 600a and 600b, in which one of the base layers is partly removed by etching. By leaving the other of the base layers even after the etching, mixing of impurities may be suppressed.

The semiconductor layer 602 includes a channel region and source and drain regions. As the semiconductor layer 602, an amorphous semiconductor, a microcrystalline semiconductor, or a polycrystalline semiconductor can be used. The microcrystalline semiconductor is a semiconductor having an intermediate structure of an amorphous structure and a crystalline structure (including a single crystal and a poly crystal) and a state which is stable in free energy, and includes a crystalline region having a short-range order along with lattice distortion. A crystal region including a crystal grain with a diameter of 0.5 nm or more and 20 nm or less is included at least in part the microcrystalline semiconductor film. When silicon is contained as the main component, a Raman spectrum is shifted to a lower wavenumber side than 520 $cm^{-1}$. Diffraction peaks of (111) and (220) which are thought to be derived from a silicon crystalline lattice are observed by X-ray diffraction. Hydrogen or halogen is contained at 1 atomic % or more to compensate a dangling bond. For example, in the case where microcrystalline silicon is used, the semiconductor layer 602 is formed by performing glow discharge decomposition (plasma CVD) on a material gas. As the material gas, $Si_2H$, $SiH_2Cl_2$, $SiHCl_3$, $SiCl_4$, $SiF_4$, or the like as well as $SiH_4$ can be used. In addition, $GeF_4$ may be mixed into the material gas. Alternatively, the material gas may be diluted with $H_2$, or $H_2$ and one or more kinds of rare gas elements selected from He, Ar, Kr, or/and Ne. At that time, dilution ratio is 2 to 1000, pressure is 0.1 to 133 Pa, and power supply frequency is 1 to 120 MHz, preferably 13 to 60 MHz. In addition, temperature for heating a substrate is 300° C. or less. An impurity concentration of an atmospheric constituent impurity such as oxygen, nitrogen, or carbon, as an impurity element in the film, is preferably $1 \times 10^{20}/cm^3$ or less; specifically, the concentration of oxygen is $5 \times 10^{19}/cm^3$ or less, preferably $1 \times 10^{19}/cm^3$ or less.

In addition, the impurity regions of the semiconductor layer 602 function as source and drain regions, and are formed by addition of an n-type impurity element such as phosphorus or arsenic, or a p-type impurity element such as boron. Further, electrodes which are in contact with the impurity regions function as source and drain electrodes. In addition, an impurity element which imparts the same conductivity type can be added to each of the semiconductor layers 602. Alternatively, impurity elements imparting different conductivity types can be added to the semiconductor layers 602. Moreover, in this embodiment mode, a low-concentration impurity region (also referred to as an LDD region) whose impurity concentration is lower than that in the impurity regions serving as the source and drain regions can be provided. By providing the low-concentration region, generation of an off current can be suppressed.

As the gate insulating layer 603, one of a silicon oxide film, a silicon oxide film containing nitrogen, a silicon nitride film, and a silicon nitride film containing oxygen; or a stacked layer of two or more of the above films may be used. The gate insulating layer 603 can be formed by a sputtering method, a plasma CVD method, or the like.

The gate electrode 604 can have a single-layer structure of a conductive film or a layered structure of two or three conductive films. As a material for the gate electrode 604, a conductive film can be used. As a material for the gate electrode 604, for example, a single film of an element such as tantalum, titanium, molybdenum, tungsten, chromium, silicon, or the like; nitride film containing the aforementioned element (typically, a tantalum nitride film, a tungsten nitride film, or a titanium nitride film); an alloy film in which the aforementioned elements are combined (typically, a Mo—W alloy or a Mo—Ta alloy); a silicide film containing the aforementioned element (typically, a tungsten silicide film or a titanium silicide film); and the like can be used. Note that the aforementioned single film, nitride film, alloy film, silicide film, and the like can have a single-layer structure or a layered structure.

As the first interlayer insulating layer 605 and the second interlayer insulating layer 606, for example, one of a silicon oxide film, a silicon oxide film containing nitrogen, a silicon nitride film, and a silicon nitride film containing oxygen may be used; or a stacked layer of two or more of the above films may be used.

As the electrode 607, a single film of an element such as aluminum, nickel, carbon, tungsten, molybdenum, titanium, platinum, copper, tantalum, gold, or manganese, a nitride film containing the above element, an alloy film in which the above elements are combined, a silicide film containing the above element, or the like can be used. For example, as an alloy containing a plurality of the above elements, an aluminum alloy containing carbon and titanium, an aluminum alloy containing nickel, an aluminum alloy containing carbon and nickel, an aluminum alloy containing carbon and manganese, or the like can be used. For example, in the case where the electrode 607 is formed with a layered structure, by employing a structure in which aluminum is interposed between molybdenum, titanium, or the like, the resistance of the aluminum to heat or chemical reaction can be increased.

Note that the structure of the semiconductor element layer 505 in this embodiment mode is not limited to structures shown in FIG. 11 and FIG. 12, and a semiconductor element such as a diode, a resister element, a capacitor element, and/or a transistor having a floating gate can be provided.

In addition, for example, the transistor 601 may have an inverted staggered structure, a FinFET structure, or the like without being limited to the structures shown in FIG. 11 and FIG. 12. By employing a FinFET structure, for example, a short-channel effect caused by miniaturization in size of a transistor can be suppressed. Alternatively, a semiconductor substrate such as an SOI substrate can be used for the transistor 601. Since a transistor manufactured using a semiconductor substrate has high mobility, the size of the transistor can be reduced. Alternatively, a transistor formed using an organic semiconductor, a transistor formed using a carbon nanotube, or the like can also be used.

The first insulating layer 506 functions as an interlayer insulating layer and may be formed using any one of a silicon oxide film, a silicon oxide film containing nitrogen, a silicon nitride film, and a silicon nitride film containing oxygen; or a stacked layer of two or more of the above films, for example. By covering the semiconductor element layer 505 with the first insulating layer 506, mixing of impurities into the semiconductor element layer 505 which is to be a semiconductor integrated circuit can be suppressed.

The second insulating layer 507 functions as an interlayer insulating layer and may be formed using resin for example.

The conductive layer 508 functions as the antenna 503 shown in FIGS. 8A and 8B and may be formed using any one or more of silver, gold, copper, nickel, platinum, palladium, tantalum, molybdenum, titanium, aluminum, and the like for example. In this embodiment mode, the antenna has a loop shape, so that the area of the functional circuit can be reduced. However, the antenna 503 is not limited to the loop shape, and any shape can be employed as long as the antenna can receive radio waves. For example, a dipole antenna, a folded dipole antenna, a slot antenna, a meander line antenna, a microstrip antenna, or the like can be used.

As the third insulating layer 509, any one of an amorphous silicon film, a silicon oxide film, a silicon oxide film containing nitrogen, a silicon nitride film, and a silicon nitride film containing oxygen; or a stacked layer of two or more of the above films can be used. Moreover, in the case where an amorphous silicon film is used, an impurity element imparting one conductivity type can be added to the amorphous silicon film. By addition of the impurity element imparting one conductivity type, electrostatic discharge of an element can be prevented. Note that a semiconductor device can be reduced in thickness by employing a structure without the third insulating layer 509.

In the semiconductor device shown in FIG. 9, a plurality of the semiconductor element layers 505, the first insulating layer 506, and the conductive layer 508 are covered with one sealing layer including the sealing layers 500 and 501. With that structure, mixing of impurities into the semiconductor element layer 505 which is to be a semiconductor integrated circuit can be suppressed.

Moreover, as in the functional circuit 502 shown in FIG. 13, the semiconductor device of this embodiment mode may have a structure in which the sealing layer 500 and the sealing layer 501 are in contact with each other in a region 514, and the semiconductor element layer 505, the first insulating layer 506, and the conductive layer 508 are covered with one sealing layer formed of the sealing layers 500 and 501. With that structure, mixing of impurities into the semiconductor element layer which is to be a semiconductor integrated circuit can be suppressed.

In this manner, by employing the above-described structure for the semiconductor device of this embodiment mode, redundancy can be increased, and thus reliability can be increased. In addition, since mixing of impurities into a semiconductor integrated circuit can be suppressed, stress to bending can be reduced, and thus resistance to external force can be increased, and the reliability of each functional circuit can be increased.

Next, a method of manufacturing the semiconductor device in this embodiment mode will be explained with reference to FIGS. 14A and 14B, FIGS. 15A and 15B, FIGS. 16A and 16B, and FIGS. 17A and 17B. FIGS. 14A and 14B, FIGS. 15A and 15B, FIGS. 16A and 16B, and FIGS. 17A and 17B are cross-sectional views showing the manufacturing method of the semiconductor device in this embodiment mode. Here, as an example, a manufacturing method of the semiconductor device with the structure shown in FIG. 11 will be described.

As shown in FIG. 14A, first, the separation layer 504 is formed over a substrate 511, and the semiconductor element layer 505 is formed over the separation layer 504. The separation layer 504 can be formed by a sputtering method, a plasma CVD method, a coating method, a printing method, or the like. Note that a coating method is a method for depositing a film by discharge of a solution on an object to be processed, and includes a spin coating method and a droplet discharge method for example. In addition, a droplet discharge method is a method for forming a pattern with a predetermined shape by discharge of a droplet of a composition containing fine particles from a small hole.

Next, the first insulating layer 506 and the second insulating layer 507 are formed so as to cover the semiconductor element layer 505.

Next, as shown in FIG. 14B, the first insulating layer 506 and the second insulating layer 507 are partly removed by etching. At that time, at least part of the first insulating layer 506 and part of the second insulating layer 507, which cover the semiconductor element layer 505, are left. In addition, an opening portion is provided in the part of the first insulating layer 506 and the part of the second insulating layer 507, which are left over the semiconductor element layer 505.

Figure 15A:
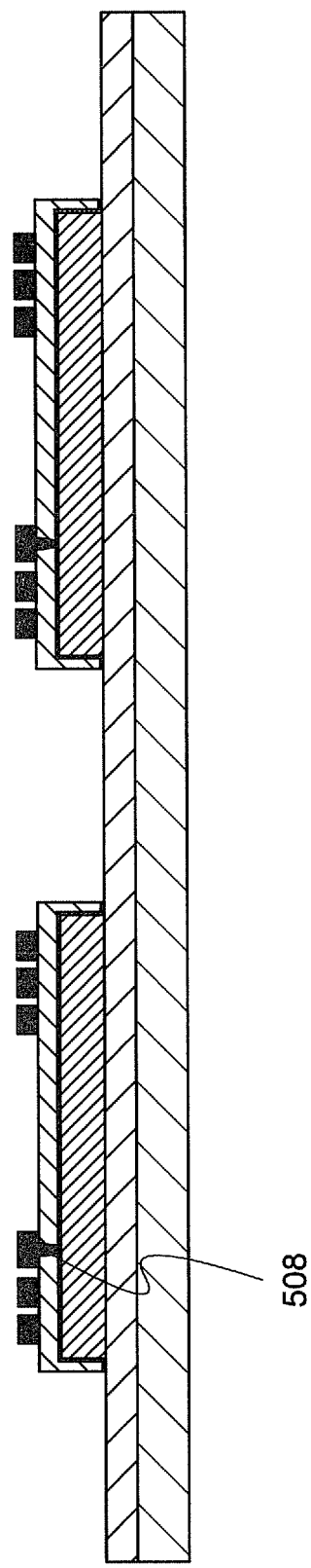
FIGS. 15A and 15B are cross-sectional views illustrating a manufacturing method of a semiconductor device in Embodiment Mode 3.

Next, as shown in FIG. 15A, the conductive layer 508 is formed so as to be partly in contact with an electrode in the semiconductor element layer 505 with the first insulating layer 506 and the second insulating layer 507 interposed therebetween. The conductive layer 508 can be formed by discharge of a droplet, a paste, or the like containing metal particles of the above-described material, which can be applied to the conductive film 508, to a substrate by a droplet discharge method (an ink jet method, a dispensing method, or the like), and drying and baking it. By forming the conductive layer 508 by a droplet discharge method, the number of steps can be reduced, and thus cost can be cut.

Figure 15B:
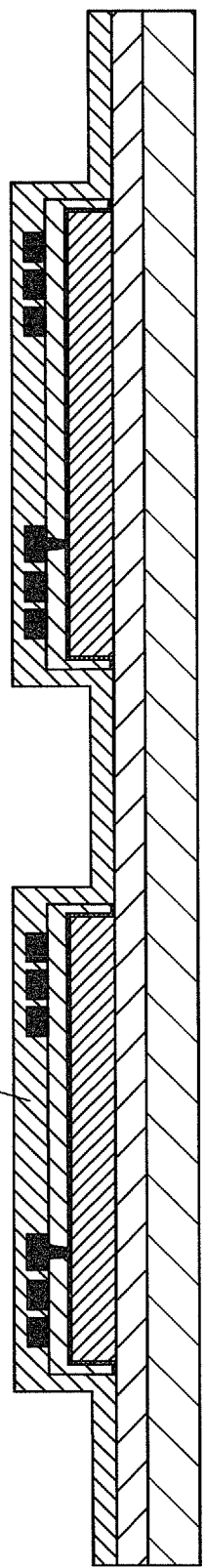

Next, as shown in FIG. 15B, the third insulating layer 509 is formed so as to cover the second insulating layer 507 and the conductive layer 508.

Figure 16A:
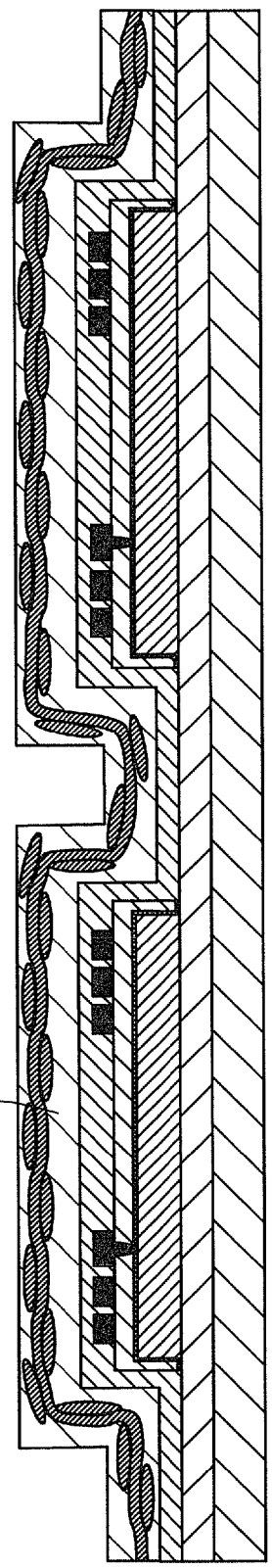
FIGS. 16A and 16B are cross-sectional views illustrating a manufacturing method of a semiconductor device in Embodiment Mode 3.

Next, as shown in FIG. 16A, the sealing layer 501 is bonded to the third insulating layer 509. As a bonding method, for example, a method of pressing the sealing layer 501 to bond it to the third insulating layer 509 can be given.

Figure 16B:
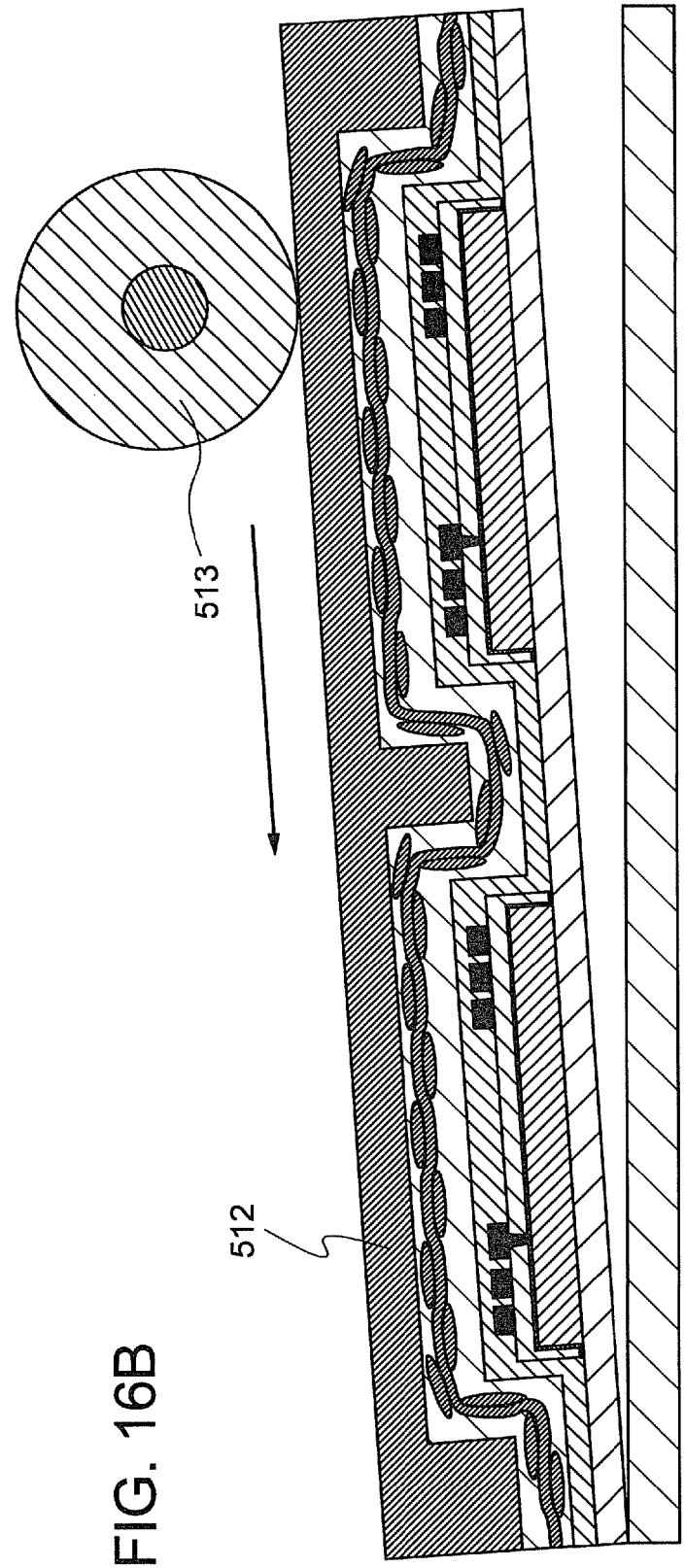

Next, as shown in FIG. 16B, an adhesive tape 512 which can be separated by light or heat is provided over the sealing layer 501, and the separation layer 504 is separated from the substrate 511 while a roller 513 is rolled on the adhesive tape 512.

Next, as shown in FIG. 17A, a surface on which the separation layer 504 is formed is irradiated with a laser to form a groove 515 in part of the separation layer 504, part of the third insulating layer 509, and part of the sealing layer 501. Note that the adhesive tape 512 may be removed before or after the formation of the groove 515.

Next, as shown in FIG. 17B, the sealing layer 500 is bonded to the surface of the third insulating layer 509 on the side from which the substrate 511 is separated. As a bonding method, for example, a method of pressing the sealing layer 500 for bonding can be given. By bonding the sealing layer 500, resin contained in the sealing layers 500 and 501 flows into the groove 515, so that the sealing layer 500 and the sealing layer 501 get together. At that time, an edge portion where the sealing layers 500 and 501 do not get together, which is on the outer side of the groove 515, is removed.

In this manner, a semiconductor device with the structure shown in FIG. 11 can be manufactured. In addition, by employing the manufacturing method of the semiconductor device of this embodiment mode, a structure in which the semiconductor element layer 505 is interposed between the sealing layers 500 and 501 can be obtained. Note that the manufacturing method of the semiconductor device described in this embodiment mode is an example, and another manufacturing method can also be employed.

Figure 18:
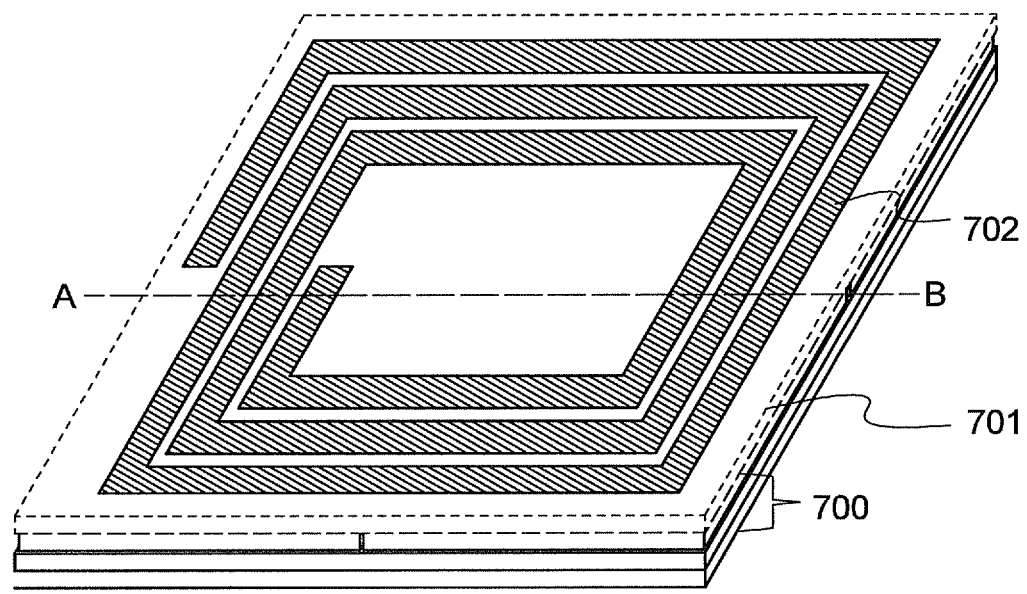
FIG. 18 is a perspective view illustrating another structure of the semiconductor device in Embodiment Mode 3.

Moreover, a semiconductor device provided with a booster antenna will be described with reference to FIG. 18. FIG. 18 is a perspective view illustrating another structure of the semiconductor device in this embodiment mode.

As shown in FIG. 18, another structure of the semiconductor device of this embodiment mode includes a functional circuit 700, a substrate 701 (a dashed line portion) provided over the functional circuit 700, and an antenna 702 provided over one surface of the substrate 701.

The functional circuit 700 has the same structure as the functional circuit 502 shown in FIG. 9.

Note that in this embodiment mode, the antenna 702 has a loop shape, so that the area of the semiconductor device can be reduced. However, the antenna 702 is not limited to the loop shape, and any shape can be employed as long as the antenna 702 can receive radio waves. For example, a dipole antenna, a folded dipole antenna, a slot antenna, a meander line antenna, a microstrip antenna, or the like can be used.

Alternatively, the antenna 702 can be attached to the functional circuit 700 without using the substrate 701. By omitting the substrate 701, the semiconductor device can be reduced in thickness.

Figure 19:
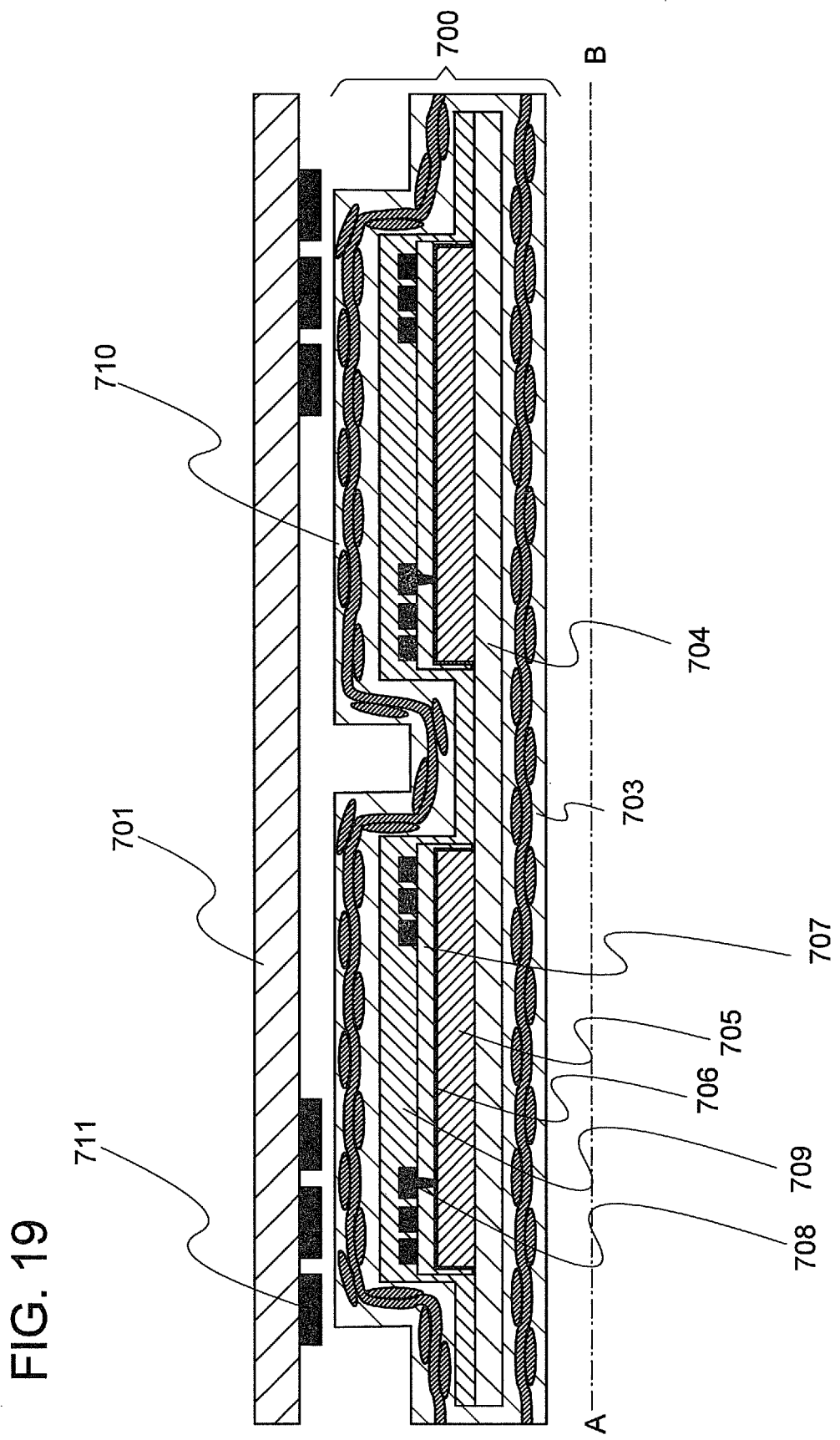
FIG. 19 is a cross-sectional view illustrating another structure of the semiconductor device in Embodiment Mode 3.
Figure 21A:
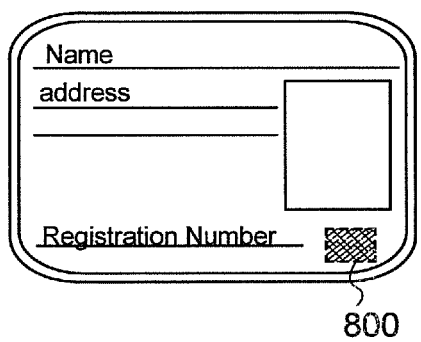
FIGS. 21A to 21F are diagrams illustrating usage examples of a semiconductor device in Embodiment Mode 4.
Figure 21B:
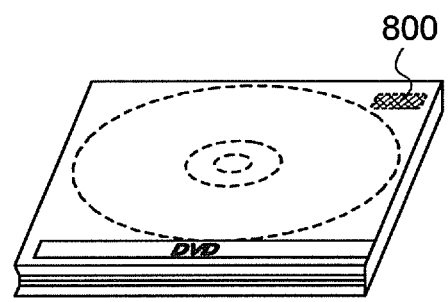
Figure 21C:
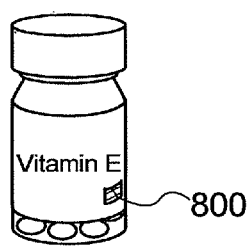
Figure 21D:
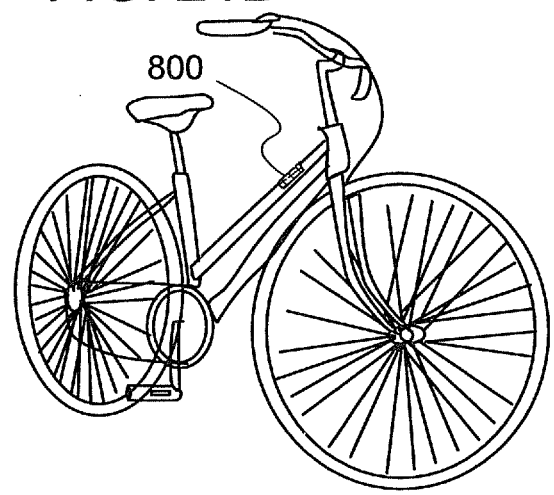
Figure 21E:
Figure 21F:
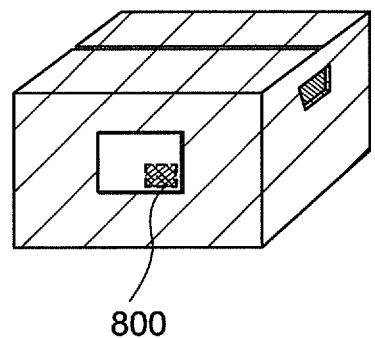

Next, a cross-sectional structure of the semiconductor device provided with the booster antenna will be described with reference to FIG. 19. FIG. 19 is a cross-sectional view of FIG. 18 along line A-B.

As shown in FIG. 19, the semiconductor device in this embodiment mode includes a functional circuit 700 and a substrate 701. The functional circuit 700 which includes the sealing layer 703, a separation layer 704 provided over the sealing layer 703, a semiconductor element layer 705 provided over the separation layer 704, a first insulating layer 706 and a second insulating layer 707 which are provided over the semiconductor element layer 705 and have an opening portion, a conductive layer 708 part of which is in contact with the semiconductor element layer 705 through the opening portion, a third insulating layer 709 provided so as to cover the conductive layer 708 and the second insulating layer 707, and the sealing layer 710 provided over the third insulating layer 709. The substrate 701 is formed over a sealing layer 710 and includes conductive layers 711.

Note that structures and materials which can be employed for the sealing layer 500, the separation layer 504, the semiconductor element layer 505, the first insulating layer 506, the second insulating layer 507, the conductive layer 508, the third insulating layer 509, and the sealing layer 501 in FIG. 9 can be employed for the sealing layer 703, the separation layer 704, the semiconductor element layer 705, the first insulating layer 706, the second insulating layer 707, the conductive layer 708, the third insulating layer 709, and the sealing layer 710 in FIG. 19, respectively.

The conductive layer 711 functions as the antenna 702 which is a booster antenna in FIG. 18 and can be formed using one or more of silver, gold, copper, nickel, platinum, palladium, tantalum, molybdenum, titanium, aluminum, and the like for example.

Note that in this embodiment mode, the antenna 702 has a loop shape, so that the area of the functional circuit can be reduced. However, the antenna 702 is not limited to the loop shape, and any shape can be employed as long as the antenna can receive radio waves. For example, a dipole antenna, a folded dipole antenna, a slot antenna, a meander line antenna, a microstrip antenna, or the like can be used.

In this manner, in the case of a structure in which the conductive layer 708 which is to be a first antenna and the conductive layer 711 which is to be a second antenna serving as a booster antenna are provided, electric power can be exchanged without contact between the first antenna and the second antenna. In addition, by providing the second antenna, there is no limitation on the frequency band of receivable radio waves, and the communication distance can be longer.

Next, a manufacturing method of the semiconductor device shown in FIG. 19 will be described with reference to FIGS. 20A and 20B. FIGS. 20A and 20B are cross-sectional views illustrating a manufacturing method of the semiconductor device of this embodiment mode having another structure.

As shown in FIG. 20A, first, the functional circuit 700 is formed by the manufacturing method of the semiconductor device described with reference to FIGS. 14A and 14B, FIGS. 15A and 15B, FIGS. 16A and 16B, and FIGS. 17A and 17B.

Next, as shown in FIG. 20B, the functional circuit 700 and the substrate 701 on which the conductive layers 711 are formed are attached to each other so as to make a surface on which the conductive layers 711 are formed face the functional circuit 700. At that time, alternatively, the substrate 701 and the functional circuit 700 can be attached to each other with an adhesive layer interposed therebetween. By providing the adhesive layer, bonding strength on the surfaces attached can be increased.

In this manner, a semiconductor device provided with the second antenna (the antenna 702) as a booster antenna can be manufactured. By employing the manufacturing method in this embodiment mode, a structure in which the semiconductor element layer 705 is covered with one sealing layer including the sealing layers 703 and 710 can be obtained. In addition, by providing a plurality of functional circuits under the second antenna, the area of the semiconductor device can be reduced.

Note that the manufacturing method of the semiconductor device described in this embodiment mode is an example, and another manufacturing method can also be employed.

Note that this embodiment mode can be combined with any of the other embodiment modes, as appropriate.

(Embodiment Mode 4)

In this embodiment mode, usage examples of the semiconductor device described in the above embodiment modes are described.

Specific usage examples of the semiconductor device of this embodiment mode will be described with reference to FIGS. 21A to 21F. FIGS. 21A to 21F are diagrams illustrating usage examples of the semiconductor device in this embodiment mode.

FIGS. 21A to 21F show usage examples of a semiconductor device in the above embodiment modes. The semiconductor device can be employed for a wide range of uses and can be provided for objects such as bills, coins, securities, bearer bonds, certificates (driver's licenses, resident cards, and the like; see FIG. 21A), containers for wrapping objects (wrapping paper, bottles, and the like; see FIG. 21C), recording media (DVD software, video tapes, and the like; see FIG. 21B), vehicles (bicycles and the like; see FIG. 21D), personal belongings (bags, glasses, and the like), foods, plants, animals, human bodies, clothes, daily necessities, or products such as electronic devices (liquid crystal display devices, EL display devices, television units, mobile phones, and the like); tags of each product (see FIGS. 21E and 21F); or the like.

A semiconductor device 800 is fixed to an object by being mounted on a printed board, being attached to a surface, or being incorporated into the object. For example, the semiconductor device 800 is incorporated in paper of a book or an organic resin package to be fixed to each object. As for the semiconductor device 800, a small size, a low profile, and light weight are achieved; thus, the design of an object is not impaired even after the semiconductor device 800 is fixed to the object. Further, by providing the semiconductor device 800 for bills, coins, securities, bearer bonds, certificates, and the like, an identification function can be obtained and forgery thereof can be prevented by utilizing the identification function. Furthermore, by providing the semiconductor device for containers for wrapping objects, recording media, personal belongings, foods, clothes, daily necessities, electronic devices, and the like, a system such as an inspection system can be carried out efficiently. Still furthermore, by providing the semiconductor device for vehicles, security against theft can be enhanced.

As described above, since the semiconductor device described in the above embodiment modes has high reliability, by applying the semiconductor device described in the above embodiment modes for usages given in this embodiment mode, authentication, security, or the like of an article can be improved.

This application is based on Japanese Patent Application serial no. 2008-020938 filed with Japan Patent Office on Jan. 31, 2008, the entire contents of which are hereby incorporated by reference.

What is claimed is:

1. A semiconductor device comprising:
   a first functional circuit comprising a first antenna and a first semiconductor integrated circuit configured to store identification information and being electrically connected to the first antenna;
   a second functional circuit comprising a second antenna and a second semiconductor integrated circuit configured to store identification information and being electrically connected to the second antenna;
   a sealing layer surrounding the first functional circuit and the second functional circuit; and
   a third antenna configured to transmit and to receive radio waves by electromagnetic coupling with the first antenna of the first functional circuit and by electromagnetic coupling with the second antenna of the second functional circuit,
   wherein the identification information in the first functional circuit is different from the identification information in the second functional circuit, and
   wherein the first functional circuit is electrically isolated from the second functional circuit.

2. A semiconductor device according to claim 1, wherein each of the first semiconductor integrated circuit and the second semiconductor integrated circuit comprises a transmission/reception circuit electrically connected to the first antenna or the second antenna, a power supply circuit electrically connected to the transmission/reception circuit, and a logic circuit configured to store the identification information and being electrically connected to the transmission/reception circuit and the power supply circuit.

3. A semiconductor device according to claim 1, wherein each of the first semiconductor integrated circuit and the second semiconductor integrated circuit comprises a transmission/reception circuit electrically connected to the first antenna or the second antenna, a power supply circuit electrically connected to the transmission/reception circuit, a logic circuit configured to store the identification information and being electrically connected to the transmission/reception circuit and the power supply circuit, a power supply control circuit electrically connected to the power supply circuit and the logic circuit, and a judging circuit electrically connected to the logic circuit and the power supply control circuit.

4. A semiconductor device according to claim 1, wherein each of the first functional circuit and the second functional circuit has the same function.

5. A semiconductor device according to claim 1, wherein each of the first functional circuit and the second functional circuit has an anti-collision function and responds at different timings in accordance with the identification information to a radio wave received from outside of the semiconductor device.

6. A semiconductor device according to claim 1, wherein the identification information is generated by using a difference in the positions of the first functional circuit and the second functional circuit, a difference in the amount of time for transmission or reception of signals of the first functional circuit and the second functional circuit, or a difference in the frequency of response signals of the first functional circuit and the second functional circuit.

7. A semiconductor device according to claim 1, wherein each of the first functional circuit and the second functional circuit is judged whether each of the first functional circuit and the second functional circuit operates or not by a radio wave transmitted from outside of the semiconductor device, and is controlled whether to be operated or not by the radio wave transmitted from outside of the semiconductor device.

8. A semiconductor device according to claim 1, wherein data to operate the first functional circuit is written in the first functional circuit, and data to stop the second functional circuit is written in the second functional circuit.

9. A semiconductor device according to claim 1, wherein thickness of the sealing layer is 10 μm or more and 100 μm or less.

10. A semiconductor device according to claim 1, wherein the sealing layer is formed of fibrous bodies impregnated with resin.

11. A semiconductor device according to claim 10, wherein the fibrous bodies are formed of carbon fiber.

12. A semiconductor device according to claim 10, wherein the fibrous bodies are formed of a woven fabric or a nonwoven fabric,
wherein the woven fabric is woven by bundles of fibers for warp yarns and welt yarns, and the nonwoven fabric is formed by stacking bundles of fibers in a random manner or in one direction.

13. A semiconductor device according to claim 10, wherein a highly thermally-conductive filler is dispersed in at least one of the resin and the fibrous bodies.

14. A semiconductor device according to claim 10, wherein carbon particles are dispersed in at least one of the resin and the fibrous bodies.

15. A semiconductor device comprising: a first functional circuit and a second functional circuit, each of the first functional circuit and the second functional circuit comprising: comprising a first antenna and a first semiconductor integrated circuit configured to store identification information and being electrically connected to the first antenna;
a second functional circuit comprising a second antenna and a second semiconductor integrated circuit configured to store identification information and being electrically connected to the second antenna;
a third antenna configured to transmit and to receive radio waves by electromagnetic coupling with the first antenna of the first functional circuit and by electromagnetic coupling with the second antenna of the second functional circuit, and
a sealing layer surrounding the first functional circuit and the second functional circuit,
wherein the identification information in the first functional circuit is different from the identification information in the second functional circuit,
wherein each of the first semiconductor integrated circuit and the second semiconductor integrated circuit comprises a judging circuit,
wherein data to operate is written to the judging circuit of the first functional circuit, and data to stop is written to the judging circuit of the second functional circuit, and
wherein the first functional circuit is electrically isolated from the second functional circuit.

16. A semiconductor device according to claim 15, wherein thickness of the sealing layer is 10 μm or more and 100 μm or less.

17. A semiconductor device according to claim 15, wherein the sealing layer is formed of fibrous bodies impregnated with resin.

18. A semiconductor device according to claim 17, wherein the fibrous bodies are formed of carbon fiber.

19. A semiconductor device according to claim 17,
wherein the fibrous bodies are formed of a woven fabric or a nonwoven fabric,
wherein the woven fabric is woven by bundles of fibers for warp yarns and welt yarns, and the nonwoven fabric is formed by stacking bundles of fibers in a random manner or in one direction.

20. A semiconductor device according to claim 17, wherein a highly thermally-conductive filler is dispersed in at least one of the resin and the fibrous bodies.

21. A semiconductor device according to claim 17, wherein carbon particles are dispersed in at least one of the resin and the fibrous bodies.

22. A semiconductor device according to claim 1, wherein each of the first antenna and the second antenna has a loop shape.

23. A semiconductor device according to claim 15, wherein each of the first antenna and the second antenna has a loop shape.

24. A semiconductor device according to claim 1, wherein the third antenna is a booster antenna.

25. A semiconductor device according to claim 1, wherein the first functional circuit and the second functional circuit are attached to a substrate on which the third antenna is formed.

26. A semiconductor device according to claim 1, wherein the first antenna in the first functional circuit is overlapped with the first semiconductor integrated circuit in the first functional circuit and the second antenna in the second functional circuit is overlapped with the second semiconductor integrated circuit in the second functional circuit.

27. A semiconductor device according to claim 1, wherein the third antenna is electrically isolated from the first functional circuit and the second functional circuit.

* * * * *

UNITED STATES PATENT AND TRADEMARK OFFICE
CERTIFICATE OF CORRECTION

PATENT NO. : 8,432,254 B2
APPLICATION NO. : 12/358345
DATED : April 30, 2013
INVENTOR(S) : Jun Koyama et al.

It is certified that error appears in the above-identified patent and that said Letters Patent is hereby corrected as shown below:

In the Claims:

At Column 25, lines 37-37, claim 15, please delete "and a second functional circuit, each of the first functional circuit and the second functional circuit comprising:".

Signed and Sealed this
Twenty-seventh Day of August, 2013

Teresa Stanek Rea
*Acting Director of the United States Patent and Trademark Office*

UNITED STATES PATENT AND TRADEMARK OFFICE
CERTIFICATE OF CORRECTION

PATENT NO. : 8,432,254 B2
APPLICATION NO. : 12/358345
DATED : April 30, 2013
INVENTOR(S) : Jun Koyama et al.

Page 1 of 1

It is certified that error appears in the above-identified patent and that said Letters Patent is hereby corrected as shown below:

In the Claims:

At Column 25, lines 36-37, claim 15, please delete "and a second functional circuit, each of the first functional circuit and the second functional circuit comprising:".

This certificate supersedes the Certificate of Correction issued August 27, 2013.

Signed and Sealed this
Twelfth Day of November, 2013

Teresa Stanek Rea
*Deputy Director of the United States Patent and Trademark Office*